(12) United States Patent
Ebata et al.

(10) Patent No.: US 9,767,998 B2
(45) Date of Patent: Sep. 19, 2017

(54) SPUTTERING TARGET

(75) Inventors: Kazuaki Ebata, Sodegaura (JP); Shigekazu Tomai, Sodegaura (JP); Shigeo Matsuzaki, Sodegaura (JP); Yuki Tsuruma, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 14/343,031

(22) PCT Filed: Sep. 6, 2012

(86) PCT No.: PCT/JP2012/005664
§ 371 (c)(1),
(2), (4) Date: May 23, 2014

(87) PCT Pub. No.: WO2013/035335
PCT Pub. Date: Mar. 14, 2013

(65) Prior Publication Data
US 2014/0252354 A1    Sep. 11, 2014

(30) Foreign Application Priority Data

Sep. 6, 2011  (JP) .................................. 2011-193917
Aug. 2, 2012  (JP) .................................. 2012-172373

(51) Int. Cl.
*H01L 29/786*    (2006.01)
*H01L 21/02*    (2006.01)
(Continued)

(52) U.S. Cl.
CPC .......... *H01J 37/3426* (2013.01); *C04B 35/01* (2013.01); *C23C 14/08* (2013.01);
(Continued)

(58) Field of Classification Search
CPC .............. H01L 29/7869; H01L 29/045; H01L 27/1225; H01L 21/02631; H01L 21/02554;
(Continued)

(56) References Cited

U.S. PATENT DOCUMENTS 5,622,653 A    4/1997 Orita et al.
5,681,671 A   10/1997 Orita et al.
(Continued)

FOREIGN PATENT DOCUMENTS

JP    H-08-245220 A    9/1996
JP    2000-077358 A    3/2000
(Continued)

OTHER PUBLICATIONS

Japanese Office Action for Application No. 2012-172373 dated Jan. 25, 2013.
Notification of Transmittal of Translation of the International Preliminary Report on Patentability dated Mar. 20, 2014, including Translation of Written Opinion of the International Searching Authority and International Search Report.
(Continued)

*Primary Examiner* — Natalia Gondarenko
(74) *Attorney, Agent, or Firm* — Foley & Lardner LLP

(57) ABSTRACT

A sputtering target including a sintered body:
the sintered body including:
indium oxide doped with Ga or indium oxide doped with Al, and
a positive tetravalent metal in an amount of exceeding 100 at. ppm and 1100 at. ppm or less relative to the total of Ga and indium, or Al and indium,
the crystal structure of the sintered body substantially including a bixbyite structure of indium oxide.

19 Claims, 3 Drawing Sheets

(51) Int. Cl.
*C23C 14/34* (2006.01)
*H01J 37/34* (2006.01)
*C23C 14/08* (2006.01)
*C23C 14/35* (2006.01)
*C04B 35/01* (2006.01)
*H01L 27/12* (2006.01)
*H01L 21/42* (2006.01)

(52) U.S. Cl.
CPC ...... *C23C 14/3414* (2013.01); *C23C 14/3464* (2013.01); *C23C 14/352* (2013.01); *H01J 37/34* (2013.01); *H01L 21/02422* (2013.01); *H01L 21/02565* (2013.01); *H01L 21/02631* (2013.01); *H01L 27/1225* (2013.01); *H01L 29/7869* (2013.01); *C04B 2235/3217* (2013.01); *C04B 2235/3232* (2013.01); *C04B 2235/3244* (2013.01); *C04B 2235/3286* (2013.01); *C04B 2235/3293* (2013.01); *C04B 2235/3418* (2013.01); *C04B 2235/5445* (2013.01); *C04B 2235/6565* (2013.01); *C04B 2235/72* (2013.01); *C04B 2235/725* (2013.01); *C04B 2235/762* (2013.01); *C04B 2235/77* (2013.01); *C04B 2235/80* (2013.01)

(58) Field of Classification Search
CPC ......... H01L 21/02422; H01L 21/02565; H01L 31/0304–31/03048; H01L 2924/0533; H01L 2924/0535; H01L 33/42; C23C 14/3414; C23C 14/086; C23C 14/08; C23C 14/34; C23C 14/3464; C23C 14/352; C04B 2235/80; C04B 2235/3418; C04B 2235/5445; C04B 2235/6565; C04B 2235/72; C04B 2235/725; C04B 2235/77; C04B 2235/3293; C04B 2235/3286; C04B 2235/3244; C04B 2235/3232; C04B 2235/762; C04B 2235/3217; C04B 35/01; H01J 37/34; H01J 37/3426
USPC .............. 257/43, 59, 57, E29.296, E33.064, 257/E21.159; 423/263, 624, 279; 252/512; 264/681; 204/298, 192.25; 438/104, 609; 428/412, 432, 448, 480, 428/702
See application file for complete search history.

(56) References Cited

U.S. PATENT DOCUMENTS

| | | |
|---|---|---|
| 5,843,341 A | 12/1998 | Orita et al. |
| 5,955,178 A | 9/1999 | Orita et al. |
| 8,148,245 B2 | 4/2012 | Ikisawa et al. |
| 8,524,123 B2 | 9/2013 | Yano et al. |
| 8,647,537 B2 | 2/2014 | Utsuno et al. |
| 2004/0191530 A1 | 9/2004 | Inoue et al. |
| 2004/0231981 A1 | 11/2004 | Takahashi et al. |
| 2009/0057136 A1* | 3/2009 | Wang et al. ............ 204/192.15 |
| 2010/0065835 A1 | 3/2010 | Inoue et al. |
| 2010/0155225 A1* | 6/2010 | Oishi et al. ............. 204/192.12 |
| 2010/0170696 A1 | 7/2010 | Yano et al. |
| 2010/0276688 A1 | 11/2010 | Yano et al. |
| 2011/0084280 A1* | 4/2011 | Nakayama .......... G02F 1/13439 257/59 |
| 2011/0180392 A1 | 7/2011 | Yano et al. |
| 2011/0180763 A1 | 7/2011 | Utsuno et al. |
| 2011/0243835 A1 | 10/2011 | Inoue et al. |
| 2011/0306165 A1 | 12/2011 | Ikisawa et al. |
| 2011/0315936 A1 | 12/2011 | Inoue et al. |
| 2012/0292617 A1 | 11/2012 | Ebata et al. |
| 2013/0118774 A1 | 5/2013 | Yano et al. |

FOREIGN PATENT DOCUMENTS

| | | |
|---|---|---|
| JP | 2003-105532 A | 4/2003 |
| JP | 2003-342068 A | 12/2003 |
| JP | 2004-149883 A | 5/2004 |
| JP | 2005-290550 A | 10/2005 |
| JP | 2007-073312 A | 3/2007 |
| JP | 2007-084842 A | 4/2007 |
| WO | WO-03/008661 A1 | 1/2003 |
| WO | WO 2008050618 A1 * | 5/2008 |
| WO | WO-2008/114588 A1 | 9/2008 |
| WO | WO-2009/084537 A1 | 7/2009 |
| WO | WO-2009/157535 A1 | 12/2009 |
| WO | WO-2010/032422 A1 | 3/2010 |
| WO | WO-2010/032431 A1 | 3/2010 |
| WO | WO-2010/707944 A1 | 6/2010 |
| WO | WO-2011/086940 A1 | 7/2011 |

OTHER PUBLICATIONS

Kawamura T et al. (2008), "1.5-V Operating fully-depleted amorphous oxide thin film transistors achieved by 63-mV/dec subthreshold slope", IEEE International Electron Devices Meeting, 2008, pp. 77-80.

* cited by examiner

SPUTTERING TARGET

TECHNICAL FIELD

The invention relates to a sputtering target, a method for producing the same, an oxide semiconductor thin film, a method for producing the same, a thin film transistor and a display using the same.

BACKGROUND ART

Field effect transistors, such as a thin film transistor (TFT), are widely used as the unit electronic device of a semiconductor memory integrated circuit, a high frequency signal amplification device, a device for a liquid crystal drive, or the like, and they are electronic devices which are currently most widely put into practical use. Of these, with significant improvement in displays in recent years, in various displays such as a liquid crystal display (LCD), an electroluminescence display (EL) and a field emission display (FED), a TFT is frequently used as a switching device which drives a display by applying a driving voltage to a display device.

As a material of a semiconductor layer (channel layer) which is a main component of a field effect transistor, a silicon semiconductor compound is used most widely. Generally, a silicon single crystal is used for the high frequency amplification device or the device for integrated circuits which need high-speed operation. On the other hand, an amorphous silicon semiconductor (amorphous silicon) is used for a device for driving a liquid crystal in order to satisfy the demand for realizing a large-area display.

A thin film of amorphous silicon can be formed at relatively low temperatures. However, the switching speed thereof is slow as compared with that of a crystalline thin film. Therefore, when it is used as a switching device which drives a display, it may be unable to follow the display of a high-speed animation. Specifically, amorphous silicon having a mobility of 0.5 to 1 $cm^2/Vs$ could be used in a liquid crystal television of which the resolution is VGA. However, if the resolution is equal to or more than SXGA, UXGA and QXGA, a mobility of 2 $cm^2/Vs$ or more is required. Moreover, if the driving frequency is increased in order to improve the image quality, a further higher mobility is required.

As for a crystalline silicon-based thin film, although it has a high mobility, there are problems that a large amount of energy and a large number of steps are required for the production, and that a large-sized film formation is difficult. For example, when a silicon-based thin film is crystallized, laser annealing which requires a high temperature of 800° C. or more or expensive equipment. In the case of a crystalline silicon-based thin film, the device configuration of a TFT is normally restricted to a top-gate configuration, and hence, reduction in production cost such as decrease in the number of masks is difficult.

In order to solve the problem, a thin film transistor using an oxide semiconductor film formed of indium oxide, zinc oxide and gallium oxide has been studied. In general, an oxide semiconductor thin film is formed by sputtering using a target (sputtering target) composed of an oxide sintered body.

A target having a crystal structure of a homologous crystal structure compound such as $In_2Ga_2ZnO_7$ and $InGaZnO_4$ is known (Patent Documents 1 to 3). However, in this target, in order to increase the sintering density (relative density), it is required to conduct sintering in an oxidizing atmosphere. In this case, in order to reduce the resistance of the target, a reduction treatment at a high temperature is required to be conducted after sintering. Further, if the target is used for a long period of time, problems arise that the properties of the resulting thin film or the film-forming speed largely change; abnormal discharge due to abnormal growth of $InGaZnO_4$ or $In_2Ga_2ZnO_7$ occurs; particles are frequently generated during film formation or the like. If abnormal discharge occurs frequently, plasma discharge state becomes unstable, and as a result, stable film-formation is not conducted, adversely affecting the film properties.

Patent Document 4 discloses a sputtering target formed of Ga-doped indium oxide. However, a sputtering target disclosed in Patent Document 4 which are obtained by doping indium oxide with Ga containing 100 at. ppm of a metal having a valency of positive tetravalency or higher suffers from a variation in target density, and hence, it is difficult to produce the target such that it has a relative density of 97% or more.

Further, Patent Document 5 discloses a sputtering target of Al-doped indium oxide. In this sputtering target, the atomic ratio of Al is 0.001 to 45%, which means a wide composition ratio. In addition, the ratio of ions to be doped with the target having a valency of positive tetravalency of higher is wide, i.e. 10 to 5000 at. ppm. Therefore, the optimum composition region as the oxide semiconductor is not clear.

As mentioned above, studies to be made on the target when forming the oxide semiconductor film by the sputtering method are not enough.

RELATED ART DOCUMENTS

Patent Documents

Patent Document 1: JP-A-H08-245220
Patent Document 2: JP-A-2007-73312
Patent Document 3: WO2009/084537
Patent Document 4: WO2010/032422
Patent Document 5: WO2010/070944

SUMMARY OF THE INVENTION

An object of the invention is to provide a high-density and low-resistant sputtering target. An object of the invention is to provide a thin film transistor having a field effect mobility.

According to the invention, the following sputtering target or the like are provided.
1. A sputtering target comprising a sintered body:
   the sintered body comprising:
   indium oxide doped with Ga or indium oxide doped with Al, and
   a positive tetravalent metal in an amount of exceeding 100 at. ppm and 1100 at. ppm or less relative to the total of Ga and indium, or Al and indium,
   the crystal structure of the sintered body substantially comprising a bixbyite structure of indium oxide.
2. The sputtering target according to 1, wherein the atomic ratio Ga/(Ga+In) of indium oxide doped with Ga is 0.001 to 0.15.
3. The sputtering target according to 1, wherein the atomic ratio Al/(Al+In) of indium oxide doped with Al is 0.0001 to 0.08.
4. The sputtering target according to any of 1 to 3, wherein the positive tetravalent metal is one or two or more elements selected from Sn, Zr, Ti and Si.

5. The sputtering target according to any of 1 to 4, wherein the bulk resistance of the sintered body is 5 mΩcm or less.
6. The sputtering target according to any of 1 to 5, wherein the relative density of the sintered body is 97% or more.
7. A method for producing the sputtering target according to any of 1 to 6, comprising:

heating a formed body from 800° C. to a sintering temperature at a heating rate of 0.1 to 2° C./min; and holding the heated formed body at the sintering temperature for 10 to 50 hours to allow it to be sintered;
wherein the sintering temperature is 1200° C. to 1650° C.
8. An oxide semiconductor thin film formed by the sputtering method using the sputtering target according to any of 1 to 6.
9. A method for producing the oxide semiconductor thin film according to 8, wherein deposition is conducted in an atmosphere of a mixed gas of a rare gas and one or more gases selected from a water vapor, an oxygen gas and a nitrous oxide gas.
10. The method for producing the oxide semiconductor thin film according to 9, wherein deposition is conducted in an atmosphere of a mixed gas of comprising a rare gas and at least water vapor.
11. The method for producing the oxide semiconductor thin film according to 10, wherein the amount ratio of the water vapor contained in the atmosphere is 0.1% to 25% in terms of partial pressure.
12. The method for producing the oxide semiconductor thin film according to any of 9 to 11 comprising:

transporting substrates in sequence at positions opposing to 3 or more targets arranged in parallel with a prescribed interval in a vacuum chamber;

applying a negative potential and a positive potential alternately from an AC power source to each of the targets; and causing plasma to be generated on a target by applying a potential from the AC power source while switching targets to which a potential is applied between two or more targets connected to this AC power source, thereby depositing a film on a substrate surface.
13. The method for producing the oxide semiconductor thin film according to 12, wherein the AC power density of the AC power source is 3 W/cm$^2$ or more and 20 W/cm$^2$ or less.
14. The method for producing the oxide semiconductor thin film according to 12 or 13, wherein the frequency of the AC power source is 10 kHz to 1 MHz.
15. A thin film transistor comprising the oxide semiconductor thin film formed by the method according to any of 9 to 14 as a channel layer.
16. The thin film transistor according to 15, wherein the field effect mobility is 30 cm$^2$/Vs or more.
17. The thin film transistor according to 15 or 16, which comprises a protective film comprising SiN$_x$ on the channel layer.
18. A display comprising the thin film transistor according to any of 15 to 17.

According to the invention, a high-density and low-resistant sputtering target can be provided. Further, according to the invention, a thin film transistor having a high field effect mobility can be provided.

MODE FOR CARRYING OUT THE INVENTION

Figure 1:
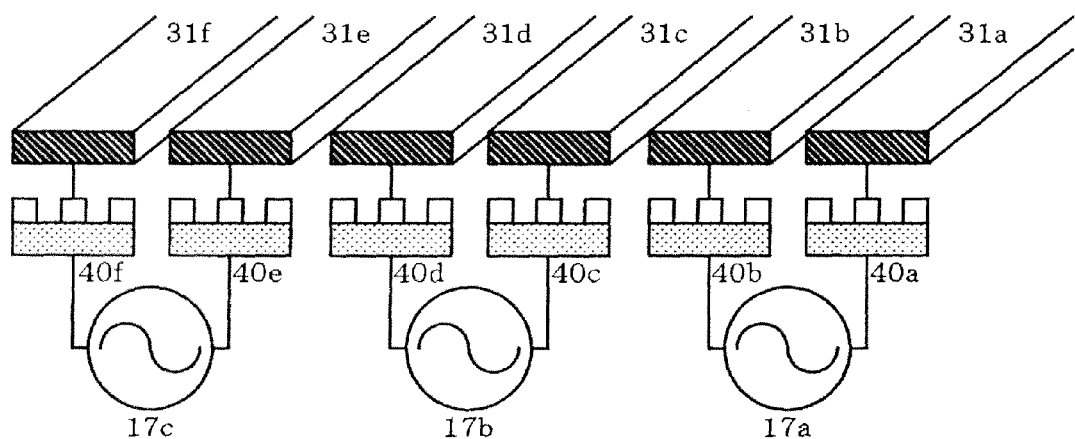
FIG. 1 is a view showing a sputtering device used in one embodiment of the invention.

Herein below, a detailed explanation will be made on the sputtering target or the like of the invention. The invention is, however, not limited to the following embodiment and examples.

I. Sintered Body and Sputtering Target

The sputtering target of the invention comprises a sintered body, the sintered body comprising Ga-doped indium oxide or Al-doped indium oxide, and comprising a positive tetravalent metal X in an amount of 100 at. ppm or larger or 1100 at. ppm or less relative to the total of Ga and indium or the total of Al and indium.

As for the crystal structure of the above-mentioned sintered body, it is substantially comprises a bixbyite structure of indium oxide.

The above-mentioned sintered body comprises a single phase of indium oxide having a bixbyite structure in which Ga or Al is in a solid-solution state. Further, it contains a positive tetravalent metal in an amount of exceeding 100 at. ppm or 1100 at. ppm or less. The sintered body preferably has a bulk resistance of 5 mΩcm or less and a relative density of 97% or more.

Therefore, the sputtering target of the invention can suppress occurrence of abnormal discharge at the time of sputtering. Further, the sputtering target of the invention is capable of forming a high-quality oxide semiconductor thin film efficiently at a low cost and in an energy-saving manner.

If the above-mentioned sintered body comprises Ga-doped indium oxide, the atomic ratio Ga/(Ga+In) is preferably 0.001 to 0.15. By allowing the atomic ratio Ga/(In+Ga) to be 0.15 or less, Ga can be dispersed uniformly in indium oxide crystals.

If the atomic ratio Ga/(Ga+In) exceeds 0.15, Ga may not be in a solid solution state in the bixbyite structure of indium oxide, and as a result, other crystal structures such as GaInO$_3$ may be precipitated. If the oxide sintered body comprises other crystal structures such as GaInO$_3$, if the target comprising the sintered body of the invention is sputtered, abnormal discharge tends to occur easily. In addition, electrons may be scattered to lower the mobility or crystallization of indium oxide may be hindered.

As for the reason of the above-mentioned abnormal discharge, the following can be assumed. Due to the un-uniformity of the target, parts differing in specific resistance tend to be present locally. As a result, impedance of the discharge system including the target may vary during the sputtering. The parts differing in specific resistance locally mean crystals such as GaInO$_3$, and by reducing the size and the number density of these crystals, occurrence of abnormal discharge can be suppressed effectively.

If the atomic ratio Ga/(Ga+In) is less than 0.001, if a thin film is deposited by using the target comprising the oxide sintered body of the invention, fine crystals may be generated in the thin film. If such thin film is heated in a post-treatment process, secondary crystallization may occur to lower the mobility or increase the carrier density with an increase in oxygen deficiency.

In view of the above, the atomic ratio of metal gallium and metal indium Ga/(Ga+In) is preferably 0.001 to 0.15, more preferably 0.01 to 0.1, further preferably 0.03 to 0.09, and particularly preferably 0.05 to 0.08.

If the above-mentioned sintered body comprises Al-doped indium oxide, the atomic ratio Al/(Al+In) is preferably 0.0001 to 0.08. By allowing the atomic ratio Al/(In+Al) to be 0.08 or less, Al can be dispersed homogeneously in indium oxide crystals.

If the atomic ratio Al/(In+Al) exceeds 0.08, Al may not be solid-solution state in the bixbyite structure of indium oxide, and other crystal structures such as $Al_2O_3$ may be precipitated.

As compared with $Ga^{3+}$ ions, $Al^{3+}$ ions have a small ionic radius. Therefore, $Al^{3+}$ ions do not tend to be in a solid solution state in the bixbyite crystal structure of indium oxide. Accordingly, as compared with the amount of Ga to be added, the amount of Al to be added is required to be suppressed to be small.

If the atomic ratio Al/(In+Al) is less than 0.0001, if a thin film is formed by using the target formed of the oxide sintered body of the invention, fine crystals may be formed in the thin film. If the thin film is heated in a post-treatment process, secondary crystallization may occur to lower the mobility or increase the carrier density with an increase in oxygen deficiency.

In view of the above, the atomic ratio of metal aluminum and metal indium Al/(Al+In) is preferably 0.0001 to 0.08, more preferably 0.001 to 0.07, further preferably 0.01 to 0.05, and particularly preferably 0.01 to 0.03.

In the sintered body used in the invention, a positive tetravalent metal X is contained. By allowing a positive tetravalent metal X to be contained, effects of increasing the sintering density of the sintered body, effects of lowering the bulk resistance of the sintered body or the like are attained. The positive tetravalent metal X is preferably one or two or more elements selected from Sn, Zr, Ti and Si. This metal X is normally contained in the form of an oxide. The metal X preferably contains at least Sn.

If the content of the positive tetravalent metal X is 100 at. ppm or less, the target density may be lowered. Therefore, the content of the positive tetravalent metal X is preferably larger than 100 at. ppm.

The content (atomic ratio) of the positive tetravalent metal X in the sintered body is represented by the following formula:

Content of positive tetravalent metal X=X/(In+M)

(M is Ga or Al)

If the amount of the positive tetravalent metal X exceeds 1100 at. ppm, the field effect mobility of a TFT in which a thin film obtained by using the target is used in a channel layer may be lowered.

In the oxide semiconductor thin film, if the $In^{3+}$ site of $In_2O_3$ is substituted by the positive tetravalent metal, ionized impurities are formed to cause carriers to be scattered, thereby lowering the mobility. Therefore, the content of the positive tetravalent metal X is preferably 1100 at. ppm or less.

In view of the above, the atomic ratio of the positive tetravalent metal X is preferably exceeding 100 at. ppm and 1100 at. ppm or less, more preferably, exceeding 120 at. ppm and 900 at. ppm or less, further preferably exceeding 120 at. ppm and 700 at. ppm or less, and particularly preferably exceeding 120 at. ppm and 600 at. ppm or less.

By controlling the content of the positive tetravalent metal X to the above-mentioned value, it is possible to allow the target to have a relative density of 97% or more and a bulk resistance of 5 mΩcm or less.

The atomic ratio of elements contained in the sintered body can be obtained by quantitatively analyzing the elements contained by Induction Coupled Plasma Atomic Emission Spectrometry (ICP-AES).

Specifically, in the analysis using ICP-AES, when a solution sample is nebulized using a nebulizer, and introduced into an argon plasma (about 6000 to about 8000° C.), each element contained in the sample absorbs thermal energy, and is excited, and the orbital electrons migrate from the ground state to the orbital at a high energy level. The orbital electrons then migrate to the orbital at a lower energy level when about $10^{-7}$ to about $10^{-8}$ seconds has elapsed. In this case, the difference in energy is emitted as light. Since the emitted light has an element-specific wavelength (spectral line), the presence or absence of each element can be determined based on the presence or absence of the spectral line (qualitative analysis).

Since the intensity (luminous intensity) of each spectral line is in proportion to the amount (number) of each element contained in the sample, the element concentration in the sample can be determined by comparison with a standard solution having a known concentration (quantitative analysis).

After specifying the elements contained in the sample by qualitative analysis, the content of each element is determined by quantitative analysis, and the atomic ratio of each element is calculated from the results.

The sintered body used in the invention may include a metal element other than In, Ga, Al and the positive tetravalent metal X as long as the advantageous effects of the invention are not impaired. The sintered body may consist essentially of In, Ga and the positive tetravalent metal X, or may consist essentially of In, Al and a positive tetravalent metal.

Here, the expression "consist essentially of" used herein means that effects as a sintered body are derived from In, Ga and the positive tetravalent metal X as mentioned above or In, Al and the positive tetravalent metal X, or unavoidable impurities may be contained as long as the advantageous effects of the invention are not impaired.

Specifically, 95 to 100 wt %, 98 to 100 wt % or 99 to 100 wt % of all metal elements constituting the sputtering target other than the positive tetravalent metal may be In and Ga or Al. Unavoidable impurities may be contained.

As for the crystal structure of the above-mentioned sintered body, it substantially comprises a bixbyite structure of indium oxide. The above-mentioned bixbyite structure can be confirmed by an X-ray diffraction analysis.

Here, the "substantially" means that the effects of the sintered body are derived from the bixbyite structure or that 90 vol % or more, preferably 95 vol % or more, further preferably 98 vol % or more of the above-mentioned crystal structure is indium oxide having a bixbyite structure.

Normally 90 vol % or more, preferably 95 vol % or more, and further preferably 98 vol % or more of the above-mentioned sintered body is formed of a crystal structure. It is preferred that 90 vol % or more of the sintered body be formed of a crystal structure, and that 90 vol % or more of the crystal structure be indium oxide having a bixbyite structure.

It is preferred that the sintered body used in the invention have a relative density of 97% or more. If an oxide semiconductor is deposited on a large-sized substrate (1G or more) with an increased sputtering output, it is preferred that the relative density be 97% or more.

Relative density is at least 97%, sputtering stable state is maintained. Even when the film is formed by increasing the sputtering power on a large substrate, as long as the relative density is 97% or more, blackening of the target surface or occurrence of abnormal discharge can preferably be prevented. The relative density is preferably 98% or more, with 99% or more being further preferable.

The relative density is a density which is relatively calculated for the theoretical density which is calculated from the weighted average. The density calculated from the weighted average is a theoretical density, which is assumed to be 100%.

The relative density can be measured by the Archimedian method. That is, the relative density is obtained by dividing an actually measured relative density value with a theoretical density, followed by multiplying by 100.

The relative density is preferably 100% or less. If the relative density exceeds 100%, metal particles may be generated in a sintered body or a lower oxide may be formed. Therefore, it is required to control the oxygen supply amount during deposition strictly.

Further, the density can be adjusted by a post treatment or the like such as a heat treatment in the reductive atmosphere after sintering. As the reductive atmosphere, an atmosphere such as argon, nitrogen and hydrogen, or an atmosphere of a mixture of these gases.

It is desired that the maximum particle size of the crystal in the sintered body used in the invention be 5 μm or less. If the indium oxide crystal is grown to have a particle size 5 μm or less, nodules may hardly be generated.

When the target surface is ground by sputtering, the grinding speed differs depending on the direction of the crystal surface, whereby unevenness is generated on the target surface. The size of this unevenness varies depending on the particle size of the crystal present in the sintered body. It is assumed that, and in the target formed of a sintered body having a large crystal particle size, a greater scale of unevenness occurs, and nodules are generated from this convex part.

The maximum particle size of the crystal of the sputtering target is obtained as follows. If the sputtering target of the invention has a circular shape, at five locations in total, i.e. the central point (one) and the points (four) which are on the two central lines crossing orthogonally at this central point and are middle between the central point and the peripheral part, or if the sputtering target has a square shape, at five locations in total, i.e. the central point (one) and middle points (four) between the central point and the corner of the diagonal line of the square, the maximum diameter is measured for the biggest particle observed within a 100 μm square. The maximum particle size is the average value of the particle size of the biggest particle present in each of the frames defined by the five locations. As for the particle size, the longer diameter of the crystal particle is measured. The crystal particles can be observed by the scanning electron microscopy (SEM).

The method for producing a sputtering target of the invention comprises the following two steps:
(1) A step in which raw material compounds are mixed and formed to form a formed body
(2) A step in which the above-mentioned formed body is sintered Herein below, each step will be explained.
(1) A Step in which Raw Material Compounds are Mixed and Formed to Obtain a Formed Body No specific restrictions are imposed on the raw material compound. It suffices that the raw material compound be a compound comprising In, a compound comprising Ga or Al, and a compound comprising the positive tetravalent metal X.

It is preferable to adjust the amount such that the sintered body satisfies an atomic ratio Ga/(Ga+In) of 0.001 to 0.15 or Al/(Al+In) of 0.0001 to 0.08.

The positive tetravalent metal X is used such that the content in the sintered body exceeds 100 at. ppm and 1100 at. ppm or less.

As the compound comprising In and as the compound comprising Ga or Al, a combination of indium oxide, and gallium metal or aluminum metal, a combination of indium oxide and gallium oxide or aluminum oxide or the like can be given.

The raw material is preferably powder.

It is preferred that the raw material be a mixed powder of indium oxide, and gallium oxide or aluminum oxide.

If a metal simple substance is used as a raw material, when a combination of indium oxide, and gallium metal or aluminum metal is used as raw material powders, for example, metal particles of gallium or aluminum may be present in the resulting sintered body. As a result, metal particles on the target surface are molten during deposition and hence cannot be emitted from the target, resulting in a great difference between the composition of the film and the composition of the sintered body.

The positive tetravalent metal X can be contained in the sintered body by adding an oxide containing a positive tetravalent metal such as $SnO_2$, $TiO_2$, $ZrO_2$, $SiO_2$ or the like, for example.

The average particle diameter of the raw material powder is preferably 0.1 μm to 1.2 μm, more preferably 0.1 μm to 1.0 μm or less. The average particle diameter of the raw material powder can be measured by a laser diffraction particle size distribution measuring apparatus or the like.

For example, $In_2O_3$ powder having an average particle diameter of 0.1 μm to 1.2 μm, $Ga_2O_3$ powder having an average particle diameter of 0.1 μm to 1.2 μm, $Al_2O_3$ powder having an average particle diameter of 0.1 μm to 1.2 μm and an oxide comprising the positive tetravalent metal X having an average particle diameter of 0.1 μm to 1.2 μm as the raw material powder are used, and these powders are compounded such that the atomic ratio Ga/(Ga+In) becomes 0.001 to 0.15 or Al/(Al+In) becomes 0.0001 to 0.08, the content of the tetravalent metal X becomes exceeding 100 at. ppm and 1100 at. ppm or less.

The method for mixing and forming of a raw material compound is not particularly restricted, and a known method can be used. For example, a water-based solvent is compounded with raw material powders including indium oxide powder, and gallium oxide powder or aluminum oxide powder and an oxide comprising the positive tetravalent metal X, and the resulting slurry is mixed for 12 hours or more. Then, the mixture is subjected to solid-liquid separation, dried and granulated, and the granulated product is then put in a mold and formed.

As for the method for mixing the raw material powder, a wet or dry ball mill, a vibration mill, a beads mill or the like can be used. In order to obtain uniform and fine crystal particles and voids, the most preferable method is a beads mill mixing method since it can pulverize the aggregate efficiently for a short period of time and can realize a favorable dispersed state of additives.

When a ball mill is used for mixing, the mixing time is preferably 15 hours or more, more preferably 19 hours or more. If the mixing time is insufficient, a high-resistant compound such as $GaInO_2$ may be generated in the resulting oxide sintered body.

When a beads mill is used for pulverizing and mixing, the pulverizing and mixing time is varied depending on the size of the apparatus used and the amount of slurry to be treated. However, the pulverizing and mixing time is controlled appropriately such that the particle distribution in the slurry becomes uniform, i.e. all of the particles have a particle size of 1 µm or less.

At the time of mixing, an arbitral amount of a binder is added, and mixing may be conducted simultaneously with the addition of the binder. As the binder, polyvinyl alcohol, vinyl acetate or the like can be used.

Granulated powder is obtained from the raw material powder slurry. For granulation, it is preferable to use quick dry granulation. As the apparatus for quick dry granulation, a spray dryer is widely used. Specific drying conditions are determined according to conditions such as the concentration of slurry to be dried, the temperature of hot air used for drying and the amount of wind. For actually conducting the quick dry granulation, it is required to obtain optimum conditions in advance.

In the case of quick dry granulation, a homogenous granulated powder tends to be obtained easily. That is, since the speed of sedimentation differs due to the difference in specific gravity of the raw material powder, separation of $In_2O_3$ powder, ZnO powder and $Al_2O_3$ powder can be prevented. If a sintered body is made by using this uniform granulated powder, abnormal discharge due to the presence of $Al_2O_3$ or the like can be prevented.

The granulated powder can normally be formed at a pressure of 1.2 ton/cm$^2$ or more by means of a mold press or cold isostatic pressing (CIP).

(2) Step in which the Formed Body is Sintered

The resulting formed body is sintered at 1200 to 1650° C. for 10 to 50 hours to obtain a sintered body.

The sintering temperature is preferably 1350 to 1600° C., more preferably 1400 to 1600° C., and further preferably 1450 to 1600° C. The sintering time is preferably 12 to 40 hours, more preferably 13 to 30 hours.

If the sintering temperature is 1200° C. or higher and the sintering time is longer than 10 hours, formation of $GaInO_3$, $Al_2O_3$ or the like within the target can be suppressed, thereby preventing abnormal discharge. On the other hand, if the sintering temperature exceeds 1650° C. or the sintering time is shorter than 50 hours, an increase in average crystal diameter due to significant crystal particle growth can be prevented or generation of large voids can be suppressed, thereby preventing a lowering in the strength of a sintered body or occurrence of abnormal discharge.

Further, by allowing the sintering temperature to be 1650° C. or less, sublimation of Ga can be suppressed.

For sintering the formed body, in addition to the atmospheric sintering a pressure sintering method such as hot pressing, oxygen atmosphere sintering and hot isostatic pressing or the like can be used. In respect of a decrease in production cost, possibility of mass production and easiness in production of a large-sized sintered body, it is preferable to use atmospheric sintering.

In the atmospheric sintering a formed body is sintered in the air or the oxidizing gas atmosphere. Preferably, a formed body is sintered in the oxidizing gas atmosphere. The oxidizing gas atmosphere is preferably an oxygen gas atmosphere. It suffices that the oxygen gas atmosphere be an atmosphere having an oxygen concentration of 10 to 100 vol %, for example. When the sintered body of the invention is fabricated, the density of the sintered body can be further increased by introducing an oxygen gas atmosphere during the heating step.

As for the heating rate on sintering, it is preferred that the heating rate be 0.1 to 2° C./min in a temperature range of from 800° C. to a sintering temperature (1200 to 1650° C.).

In the Ga-doped indium oxide target or the Al-doped indium oxide target, a temperature range of from 800° C. and higher is a range where sintering proceeds most quickly. If the heating rate in this temperature range is less than 0.1° C./min, growth of crystal particles becomes significant, whereby an increase in density may not be attained. On the other hand, if the heating rate is higher than 2° C./min, $GaInO_3$, $Al_2O_3$ or the like may be deposited within the target.

The heating rate from 800° C. to a sintering temperature is preferably 0.1 to 1.3° C./min, more preferably 0.1 to 1.1° C./min.

In order to allow the bulk resistance of the sintered body obtained in the above-mentioned sintering step to be uniform in the entire target, a reduction step may be further provided, if necessary.

As the reduction method, a reduction treatment by firing in a reductive gas, a reduction treatment by vacuum calcination, a reduction treatment by calcination in an inert gas or the like can be given, for example.

In the case of a reduction treatment by calcination in a reductive gas, hydrogen, methane, carbon monoxide, or a mixed gas of these gases with oxygen or the like can be used.

In the case of a reduction treatment by calcination in an inert gas, nitrogen, argon, or a mixed gas of these gases with oxygen or the like can be used.

The temperature at the time of the above-mentioned reduction treatment is normally 100 to 800° C., preferably 200 to 800° C. The reduction treatment is conducted normally for 0.01 to 10 hours, preferably 0.05 to 5 hours.

To sum up, in the method for producing a sintered body used in the invention, a water-based solvent is compounded with raw material powders containing mixed powder of an oxide containing a positive tetravalent metal (an oxide comprising one or two or more of $SnO_2$, $TiO_2$, $ZrO_2$ and $SiO_2$) and indium oxide powder, and gallium oxide powder or aluminum oxide powder, and the resulting slurry is mixed for 12 hours or longer. Thereafter, the slurry is subjected to solid-liquid separation, dried and granulated. Subsequently, the granulated product is put in a mold and formed. Then, the resulting formed product is calcined at 1200 to 1650° C. for 10 to 50 hours with a heating rate in a temperature range of from 800° C. to the sintering temperature being 0.1 to 2° C./min, whereby a sintered body can be obtained.

By processing the sintered body obtained above, the sputtering target of the invention can be obtained. Specifically, by grinding the sintered body into a shape suited to be mounted in a sputtering apparatus, a sputtering target material is obtained. Then, the sputtering target material is bonded to a backing plate, whereby a sputtering target can be obtained.

Specifically, in order to allow the sintered body to be a target material, the sintered body is ground by means of a surface grinder to allow the surface roughness Ra to be 0.5 µm or less. Further, the sputtering surface of the target material may be subjected to mirror finishing, thereby allowing the average surface roughness thereof. Ra to be 1000 Å or less.

For this mirror finishing (polishing), known polishing techniques such as mechanical polishing, chemical polishing, mechano-chemical polishing (combination of mechanical polishing and chemical polishing) or the like may be used. For example, it can be obtained by polishing by means of a fixed abrasive polisher (polishing liquid: water) to attain a roughness of #2000 or more, or can be obtained by a process in which, after lapping by a free abrasive lap (polisher: SiC paste or the like), lapping is conducted by using diamond paste as a polisher instead of the SiC paste. There are no specific restrictions on these polishing methods.

It is preferable to finish the surface of the target material by means of a #200 to #10,000 diamond wheel, particularly preferably by means of a #400 to #5,000 diamond wheel. If a diamond wheel with a mesh size of from #200 to larger than #10,000 is used, the target material may be broken easily.

It is preferred that the surface roughness Ra of the target material be 0.5 μm or less and that the grinding surface have no directivity. If Ra is 0.5 μm or less or the grinding surface has no directivity, occurrence of abnormal discharge may preferably be prevented or generation of particles may preferably be prevented.

The thus processed target material may be subjected to a cleaning treatment. For cleaning, air blowing, washing with running water or the like can be used. When foreign matters are removed by air blowing, foreign matters can be removed more effectively by air intake by means of a dust collector from the side opposite from the nozzle.

Since the above-mentioned air blow or washing with running water has its limit, ultrasonic cleaning or the like can also be conducted. In ultrasonic cleaning, it is effective to conduct multiplex oscillation within a frequency range of 25 to 300 KHz. For example, it is preferable to perform ultrasonic cleaning by subjecting 12 kinds of frequency composed of every 25 KHz in a frequency range of 25 to 300 KHz to multiplex oscillation.

The thickness of the target material is normally 2 to 20 mm, preferably 3 to 12 mm, and particularly preferably 4 to 6 mm.

By bonding the target material obtained in the manner as mentioned above to a backing plate, a sputtering target can be obtained. A plurality of target materials may be provided in a single backing plate to be used as a substantially single target.

II. Oxide Thin Film

The method for producing an oxide thin film (an oxide semiconductor thin film) of the invention is characterized in that it is formed by a sputtering method by using the above-mentioned sputtering target.

The oxide thin film produced by the method for producing an oxide thin film of the invention comprises indium, gallium, a positive tetravalent metal X and oxygen, or indium, aluminum, a positive tetravalent metal X and oxygen, and normally, an atomic ratio Ga/(Ga+In) is 0.001 to 0.15 or an atomic ratio Al/(Al+In) is 0.0001 to 0.08.

Gallium oxide or aluminum oxide has an effect of decreasing the lattice constant of indium oxide. As a result, the 5s orbitals of indiums in the crystal is overlapped to a higher degree, whereby improvement of mobility can be expected.

If the atomic ratio Ga/(Ga+In) of the oxide thin film is less than 0.001, or the atomic ratio Al/(Al+In) is less than 0.0001, fine crystals may be formed immediately after deposition, and secondary crystallization may occur during heating as a post treatment. In the thin film which has been subjected to secondary crystallization, not only mobility is lowered but a film suffers oxygen deficiency, whereby an increase in carrier concentration may occur.

An oxide thin film formed by using the sputtering target having an atomic ratio of Ga/(Ga+In) exceeding 0.15 or an atomic ratio of Al/(Al+In) exceeding 0.08, $Ga_2O_3$ or $Al_2O_3$ may be precipitated in the thin film, causing electrons to be scattered to lower the mobility.

The above-mentioned oxide thin film preferably has a band gap of 3.7 eV or more.

As the representative technique to evaluate the band gap, spectroscopic ellipsometry can be given. Spectroscopic ellipsometry is a technique in which linearly polarized light is incident on a sample, and the polarized state of light reflected by the sample is examined (normally, elliptically polarized light), and fitting is conducted by a model optimum for describing the physical properties of a film, whereby the refractive index n and the extinction coefficient k (optical constant) or the film thickness, surface roughness, the roughness of an interface or the like are measured. Further, other physical properties such as the crystallinity or the anisotropy, the electrical resistivity, the band gap or the like can be anticipated.

Due to a high conductivity, a DC sputtering method having a high deposition speed can be applied to the sputtering target of the invention.

In addition to the above-mentioned DC sputtering, the RF sputtering method, the AC sputtering method and the pulse DC sputtering method can be applied to the sputtering target of the invention, and sputtering free from abnormal discharge can be conducted.

The oxide semiconductor thin film can also be formed by using the above-mentioned sintered body by the deposition method, the sputtering method, the ion-plating method, the pulse laser deposition method or the like.

As the sputtering gas (atmosphere), a mixed gas of a rare gas atom such as argon and an oxidizing gas can be used. Examples of the oxidizing gas include $O_2$, $CO_2$, $O_3$, $H_2O$ and $N_2O$. As the sputtering gas, a mixed gas containing a rare gas (rare gas atom) and one or more gases (molecules) selected from water vapor (a water molecule), an oxygen gas (an oxygen molecule) and a nitrous oxide gas (a nitrous oxide molecule) is preferable. A mixed gas containing a rare gas atom and at least a water molecule is more preferable.

The carrier concentration of the oxide semiconductor thin film is normally $10^{18}/cm^3$ or less, preferably $10^{13}$ to $10^{18}/cm^3$ or less, further preferably $10^{14}$ to $10^{18}/cm^3$, and particularly preferably $10^{15}$ to $10^{18}/cm^3$.

If the carrier concentration of the oxide layer is $10^{18}$ $cm^{-3}$ or less, current leakage may not occur easily when a device such as a thin film transistor is fabricated. Further, since the transistor may not become normally-on or may not have a small on-off ratio, good transistor performance may be exhibited. Further, a carrier concentration of $10^{13}$ $cm^{-3}$ or more is preferable, since the device can be driven as a TFT.

The carrier concentration of the oxide semiconductor thin film can be measured by the hall effect measurement.

The oxygen partial pressure at the time of film formation by sputtering is preferably 0% or more and less than 40%. A thin film formed under the conditions in which the oxygen partial pressure is less than 40% may not have easily a significantly decreased carrier concentration.

The oxygen partial pressure is preferably 0 to 30% or more and particularly preferably 0 to 10%.

The partial pressure of water contained in a sputtering gas (atmosphere) at the time of depositing an oxide thin film in the invention, i.e. $[H_2O]/([H_2O]+[rare\ gas]+[other\ gas])$, is preferably 0 to 25%.

On the other hand, if the water partial pressure is 25% or less, the film density may hardly be lowered, and as a result, the degree of overlapping of the In 5s orbital may not become small, and as a result, mobility is not lowered easily.

The water partial pressure in the atmosphere at the time of sputtering is more preferably 0.7 to 13%, with 1 to 6% being particularly preferable.

The partial pressure of a rare gas contained in the sputtering gas (atmosphere) is preferably 90% or more, and more preferably 95% or more.

The substrate temperature at the time of deposition by sputtering is preferably 25 to 120° C., further preferably 25 to 100° C., and particularly preferably 25 to 90° C. If the substrate temperature at the time of deposition is 120° C. or less, fine crystals may not tend to be formed easily in the film immediately after the deposition, and the carrier concentration of the thin film after crystallization by heating hardly exceeds $10^{18}/cm^3$. Further, if the substrate temperature at the time of deposition is 25° C. or more, the density of the thin film may not be lowered easily, and as a result, mobility of a TFT is hardly lowered.

It is preferred that the oxide thin film obtained by sputtering be further subjected to an annealing treatment by holding at 150 to 500° C. for 15 minutes to 5 hours. The annealing treatment temperature after deposition is more preferably 200° C. or more and 450° C. or less, further preferably 250° C. or more and 350° C. or less. By conducting the above-mentioned annealing treatment, semiconductor properties can be obtained.

The heating atmosphere is not particularly restricted. In respect of carrier control properties, the air atmosphere or the oxygen-circulating atmosphere is preferable.

In the annealing treatment as the post treatment of the oxide thin film, in the presence or absence of oxygen, a lamp annealing apparatus, a laser annealing apparatus, a thermal plasma apparatus, a hot air heating apparatus, a contact heating apparatus or the like can be used.

The distance between the target and the substrate at the time of sputtering is preferably 1 to 15 cm in a direction perpendicular to the deposition surface of the substrate, with 2 to 8 cm being further preferable. If this distance is 1 cm or more, the kinetic energy of particles of target-constituting elements which arrive the substrate can be prevented from becoming excessively large, good film properties may be obtained, and in-plane distribution of the film thickness and the electric characteristics may occur. If the interval between the target and the substrate is 15 cm or less, the kinetic energy of particles of target-constituting elements can be prevented from becoming too small, and a dense film may be obtained, and as a result, good semiconductor properties may be attained.

As for the formation of an oxide thin film, it is desirable that film formation be conducted by sputtering in an atmosphere having a magnetic field intensity of 300 to 1500 gauss. If the magnetic field intensity is 300 gauss or more, since the plasma density can be prevented from lowering, sputtering may be conducted if the sputtering target has a high resistance. On the other hand, if the magnetic field intensity 1500 gauss or less, the film thickness and the electric characteristics of the film may not be poor-controlled.

No specific restrictions are imposed on the pressure of a gas atmosphere (sputtering pressure), as long as plasma is stably discharged. The pressure is preferably 0.1 to 3.0 Pa, further preferably 0.1 to 1.5 Pa, with 0.1 to 1.0 Pa being particularly preferable. If the sputtering pressure 3.0 Pa or less, the mean free path of sputtering particles may be in an appropriate range, thereby preventing lowering of density of a thin film. If the sputtering pressure is 0.1 Pa, or more, fine crystals may not be formed in a film during film formation. Meanwhile, the sputtering pressure is the total pressure in the system at the start of sputtering after a rare gas (e.g. argon), water vapor, an oxygen gas or the like are introduced.

The oxide semiconductor thin film may be formed by the following alternate sputtering.

Specifically, substrates are sequentially conveyed to positions opposing to three or more targets which are provided in a vacuum chamber in parallel with a prescribed interval being provided, and a negative potential and a positive potential are alternatively applied to each of the targets from an AC power source, whereby plasma is generated on the target and a film is formed on the surface of the substrate.

At this time, at least one output from the AC power source is connected to two or more targets connected in a branched manner, and between these targets, film formation is conducted while switching the target to which a potential is applied. That is, at least one output from the AC power source is connected to two or more targets, and film formation is conducted while applying different potentials to adjacent targets.

If an oxide semiconductor thin film is formed by alternate sputtering, it is preferred that sputtering be conducted in an atmosphere of a mixed gas containing a rare gas and at least one or more gases selected from water vapor, an oxygen gas and a nitrous oxide gas. It is particularly preferable to conduct sputtering in an atmosphere of a mixed gas containing water vapor.

If deposition is conducted by AC sputtering, not only it is possible to obtain an oxide layer which has excellent large-area uniformity on the industrial basis, and also it can be expected that the use efficiency of the target is increased.

If a film is formed by sputtering on a large-area substrate in which the length of one side exceeds 1 m, it is preferable to use an AC sputtering apparatus for producing a large-area film such as that disclosed in JP-A-2005-290550.

The AC sputtering apparatus disclosed in JP-A-2005-290550 specifically has a vacuum chamber, a substrate holder arranged within the vacuum chamber and a sputtering source arranged at a position opposing to this substrate holder. FIG. 1 shows essential parts of a sputtering source of the AC sputtering apparatus. The sputtering source has a plurality of sputtering parts, which respectively have plate-like targets 31a to 31f. Assuming that the surface to be sputtered of each target 31a to 31f is a sputtering surface, the sputtering parts are arranged such that the sputtering surfaces are on the same plane. Targets 31a to 31f are formed in a long and narrow form having a longitudinal direction, and they have the same shape. The targets are arranged such that the edge parts (side surface) in the longitudinal direction of the sputtering surface are arranged in parallel with a prescribed interval. Accordingly, the side surfaces of the adjacent targets 31a to 31f are in parallel.

Outside the vacuum chamber, alternative power sources 17a to 17c are arranged. Of the two terminals of terminals 17a to 17c, one terminal is connected to one electrode of the adjacent two electrodes (not shown), and the other terminal is connected to the other electrode. The electrode is closely attached to the side opposite to the sputtering surface of the target. The two terminals of each AC power source output voltages differing in polarity (positive and negative), and to adjacent two targets 31a to 31f, an alternate voltage differing in polarity is applied from the AC power sources 17a to 17c. Therefore, of the adjacent targets 31a to 31f, if one is set in a positive potential, the other is set in a negative potential.

On the side opposite to the targets 31a to 31f of the electrode, magnetic field forming means 40a to 40f are arranged. Each magnetic field forming means has a long and narrow ring-like magnet having an approximate same size as that of the external circumference of the targets 31a to 31f, and a bar-like magnet which is shorter than the length of the ring-like magnet.

Each ring-like magnet is arranged at the right behind one corresponding targets 31a to 31f, such that the ring-like magnets are arranged in parallel with the longitudinal direction of the targets 31a to 31f. As mentioned above, since the targets 31a to 31f are arranged in parallel with a prescribed interval, the ring-like magnets are arranged with the same interval as that for the targets 31a to 31f.

The alternative power density when an oxide target is used in AC sputtering is preferably 3 W/cm$^2$ or more and 20 W/cm$^2$ or less. If the power density is 3 W/cm$^2$ or more, the film-forming speed can be adjusted in a suitable range, whereby production economy can be ensured. A power density of 20 W/cm$^2$ or less is preferable, since breakage of the target can be prevented. A more preferable power density is 3 W/cm$^2$ to 15 W/cm$^2$.

The frequency of the AC sputtering is preferably in the range of 10 kHz to 1 MHz. If the frequency is 10 kHz or more, noise problems do not occur. A frequency of 1 MHz or less is preferable, since it is possible to prevent a problem that sputtering is conducted in other places than the desired target position due to excessively wide scattering of plasma, whereby uniformity can be maintained. A more preferable AC sputtering frequency is 20 kHz to 500 kHz. Conditions of sputtering other than those mentioned above may be appropriately selected from the conditions given above.

III. Thin Film Transistor and Display

The above-mentioned oxide thin film can be used in a thin film transistor (TFT). It can be used particularly preferably as a channel layer.

No specific restrictions are imposed on the device configuration of the thin film transistor of the invention, as long as it has the above-mentioned oxide thin film as a channel layer. Known various device configurations can be used.

As the evaluation of reliability, in the thin film transistor of the invention, it is preferred that the absolute value of a threshold value shift of a TFT before and after applying a DC stress (Vg (gate voltage)=15V, Vd (drain voltage)=15V) (stress temperature: 80° C. or less) for 10,000 seconds be less than 0.3V.

If the absolute value of the threshold voltage shift of a TFT is less than 0.3V, an increase in cost of a panel (e.g. provision of a compensation circuit to correct the shift of the threshold voltage) is hardly caused.

In the channel layer of the thin film transistor of the invention, indium oxide-based material having crystallinity is used. Due to strong In—O bonding and In—OH bonding, oxygen deficiency hardly occurs in the vacuum process. Therefore, a shift in threshold voltage after the DC stress test can be suppressed to a significantly small value.

The thickness of the channel layer in the thin film transistor of the invention is normally 10 to 300 nm, preferably 20 to 250 nm, more preferably 30 to 200 nm, further preferably 35 to 120 nm, and particularly preferably 40 to 80 nm. If the thickness of the channel layer is 10 nm or more, due to uniformity of the film thickness when the layer is formed to have a large area, the properties of a TFT fabricated may become un-uniform within the plane. A film thickness of 300 nm or less is preferable, the film formation time can be adjusted to an appropriate value.

The channel layer in the thin film transistor of the invention is normally used in the N-type region. However, in combination with various P-type semiconductors such as a P-type Si-based semiconductor, a P-type oxide semiconductor and a P-type organic semiconductor, the channel layer can be used in various semiconductor devices such as a PN junction transistor.

The band gap of a channel material used in a TFT of the invention is preferably 3.7 eV or more. By allowing the band gap to be 3.7 eV or more, deterioration of a TFT caused by backlight of an LED can be suppressed.

In the thin film transistor of the invention, it is preferred that a protective film be provided on the channel layer. It is preferred that the protective film in the thin film transistor of the invention comprise at least $SiN_x$. As compared with $SiO_2$, $SiN_x$ is capable of forming a dense film, and hence has an advantage that it has significant effects of preventing deterioration of a TFT.

The protective film may comprise, in addition to SiNx, an oxide such as $SiO_2$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $HfO_2$, $CaHfO_3$, $PbTiO_3$, $BaTa_2O_6$, $Sm_2O_3$, $SrTiO_3$ or AlN. It is preferred that the protective film substantially comprise only $SiN_x$. Here, the "substantially comprise only $SiN_x$" means that 70 wt % or more, preferably 80 wt % or more and further preferably 85 wt % or more of the thin film constituting the protective film in the thin film transistor of the invention is $SiN_x$.

Since the Ga-doped indium oxide thin oxide and the Al-doped indium oxide of the invention are crystallized, the side nearer to the back channel is hardly reduced by a process for forming a protective film, and hence, $SiN_x$ can be used as the protective film.

Before forming a protective film, it is preferred that the channel layer be subjected to an ozone treatment, an oxygen plasma treatment, a nitrogen dioxide plasma treatment or a nitrous oxide plasma treatment. Such a treatment may be conducted at any time as long as it is after the formation of a channel layer and before the formation of a protective film. However, it is desirable that the treatment be conducted immediately before the formation of a protective film. By conducting such a pre-treatment, generation of oxygen deficiency in the channel layer can be suppressed.

If hydrogen diffuses in the oxide semiconductor film during the driving of a TFT, the threshold voltage may be shifted, resulting in lowering of reliability of a TFT. By subjecting the channel layer to an ozone treatment, an oxygen plasma treatment or a nitrous oxide plasma treatment, the In—OH bonding in the crystal structure is stabilized, whereby diffusion of hydrogen in the oxide semiconductor film can be suppressed.

The thin film transistor is normally provided with a substrate, a gate electrode, a gate-insulating layer, an organic semiconductor layer (channel layer), a source electrode and a drain electrode. The channel layer is as mentioned above. A known material can be used for the substrate.

No particular restrictions are imposed on the material forming the gate insulating film in the thin film transistor of the invention. A material which is generally used can be arbitrary selected. Specifically, a compound such as $SiO_2$, $SiN_x$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $HfO_2$, $CaHfO_3$, $PbTiO_3$, $BaTa_2O_6$, $SrTiO_3$, $Sm_2O_3$, AlN or the like can be used, for example. Of these, $SiO_2$, $SiN_x$, $Al_2O_3$, $Y_2O_3$, $HfO_2$ and $CaHfO_3$ are preferable, with $SiO_2$, $SiN_x$, $HfO_2$ and $Al_2O_3$ being more preferable.

The gate insulating film can be formed by the plasma CVD (Chemical Vapor Deposition) method, for example.

If a gate insulating film is formed by the plasma CVD method and a channel layer is formed thereon, hydrogen in the gate insulating film diffuses in the channel layer, and as a result, deterioration of film quality of the channel layer or lowering of reliability of a TFT may be caused. In order to prevent deterioration of film quality of the channel layer or lowering of reliability of a TFT, it is preferred that the gate insulating film be subjected to an ozone treatment, an oxygen plasma treatment or a nitrous oxide plasma treatment before the formation of a channel layer. By conducting such a pre-treatment, deterioration of film quality of the channel layer or lowering of reliability of a TFT can be prevented.

The number of oxygen atoms of these oxides does not necessarily coincide with the stoichiometric ratio (e.g., $SiO_2$ or $SiO_x$ may be used).

The gate insulting film may have a structure in which two or more different insulating films are stacked. The gate insulating film may be crystalline, polycrystalline, or amorphous. The gate insulating film is preferably polycrystalline or amorphous from the viewpoint of easiness of industrial production.

No specific restrictions are imposed on the material forming each electrode in the thin film transistor, i.e. a drain electrode, a source electrode and a gate electrode, and materials which are generally used can be arbitrarily selected. For example, transparent electrodes such as indium tin oxide (ITO), indium zinc oxide, ZnO, $SnO_2$ or the like, a metal electrode such as Al, Ag, Cu, Cr, Ni, Mo, Au, Ti, and Ta or an alloy metal electrode containing these metals can be used.

Each of the drain electrode, the source electrode and the gate electrode may have a multi-layer stack in which two or more different conductive layers are stacked. In particular, since the source/drain electrodes are required to be used in low-resistance wiring, the electrodes may be used by sandwiching a good conductor such as Al and Cu with metals having good adhesiveness such as Ti and Mo.

The thin film transistor of the invention can be applied to various integrated circuits such as a field effect transistor, a logical circuit, a memory circuit and a differential amplifier circuit. Further, in addition to a field effect transistor, it can be applied to a static induction transistor, a Schottky barrier transistor, a Schottky diode and a resistance element.

As for the configuration of the thin film transistor of the invention, a known configuration such as a bottom-gate configuration, a bottom-contact configuration and a top-contact configuration can be used without restrictions.

In particular, a bottom-gate configuration is advantageous since high performance can be obtained as compared with a thin film transistor comprising amorphous silicon and ZnO. The bottom-gate configuration is preferable since the number of masks at the time of production can be decreased easily and the production cost for application such as a large-sized display or the like can be reduced.

The thin film transistor of the invention can preferably be used as a display.

For use in a large-sized display, a channel-etch type bottom-gate thin film transistor is particularly preferable. A channel-etch type bottom-gate thin film transistor can produce a panel for a display at a low cost since the number of photo-masks used in photolithography is small. Of these, a channel-etch type thin film transistor having a bottom-gate configuration and a channel-etch type thin film transistor having a top-contact configuration are preferable since they can be industrialized easily due to excellent properties such as mobility.

EXAMPLES

Examples 1 to 14

[Production of a Sintered Body]

The following oxide powders were used as the raw material powders. The average particle size of the raw material oxide powders was measured by means of a laser diffraction particle size analyzer (SALD-300V, manufactured by Shimadzu Corporation), and as the average particle size, the median diameter D50 was used.

Indium oxide powder: Average particle diameter 0.98 μm
Gallium oxide powder: Average particle diameter 0.96 μm
Aluminum oxide powder: Average particle diameter 0.96 μm
Tin oxide powder: Average particle diameter 0.95 μm
Zirconium oxide powder: Average particle diameter 0.99 μm
Titanium oxide powder: Average particle diameter 0.98 μm
Silicon oxide powder: Average particle diameter 0.98 μm The above-mentioned powders were weighed such that the atomic ratio Ga/(In+Ga) or Al/(In+Al) and the content of the positive tetravalent metal (atomic ratio) (X/(In+M), X: positive tetravalent metal, M: Ga or Al) shown in Table 1 were attained. After finely pulverizing and mixing uniformly, granulation was conducted after adding a binder for forming. Subsequently, the raw material powders were uniformly placed in a mold, and subjected to pressure molding at a press atmosphere of 140 MPa by means of a cold pressing machine.

The thus obtained formed body was sintered in a sintering furnace at a heating rate shown in Table 1 (from 800° C. to the sintering temperature), at a sintering temperature and for a sintering time shown in Table 1, thereby to produce a sintered body. The heating was performed in an oxygen atmosphere, and other steps were performed in air (atmosphere), and the cooling rate was 15° C./min.

[Analysis of a Sintered Body]

The relative density of the resulting sintered body was measured by Archimedian method, and was found to be 97% or more.

The bulk resistance (conductivity) was measured by a four-probe method (JIS R 1637) using a resistance meter ("Loresta" manufactured by Mitsubishi Chemical Corporation), and the results are shown in Table 1. As shown in Table 1, the bulk resistance of the sintered bodies of Examples 1 to 14 were 5 mΩcm or less.

An ICP-AES analysis was performed for the resulting sintered body, and it was confirmed that the sintered body had an atomic ratio shown in Table 1.

Figure 2:
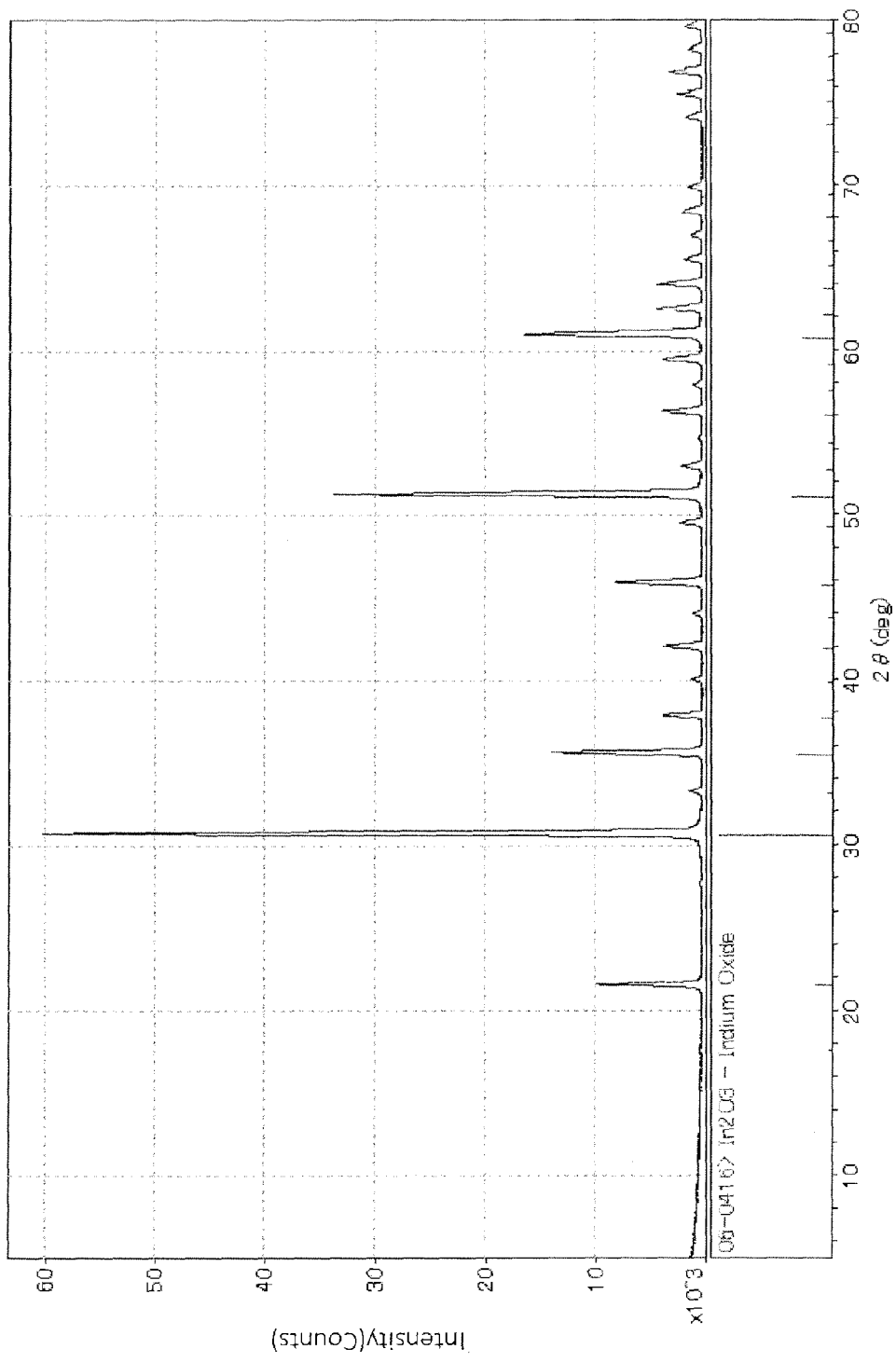
FIG. 2 is a view of an X-ray diffraction chart of a sintered body obtained in Example 1.
Figure 3:
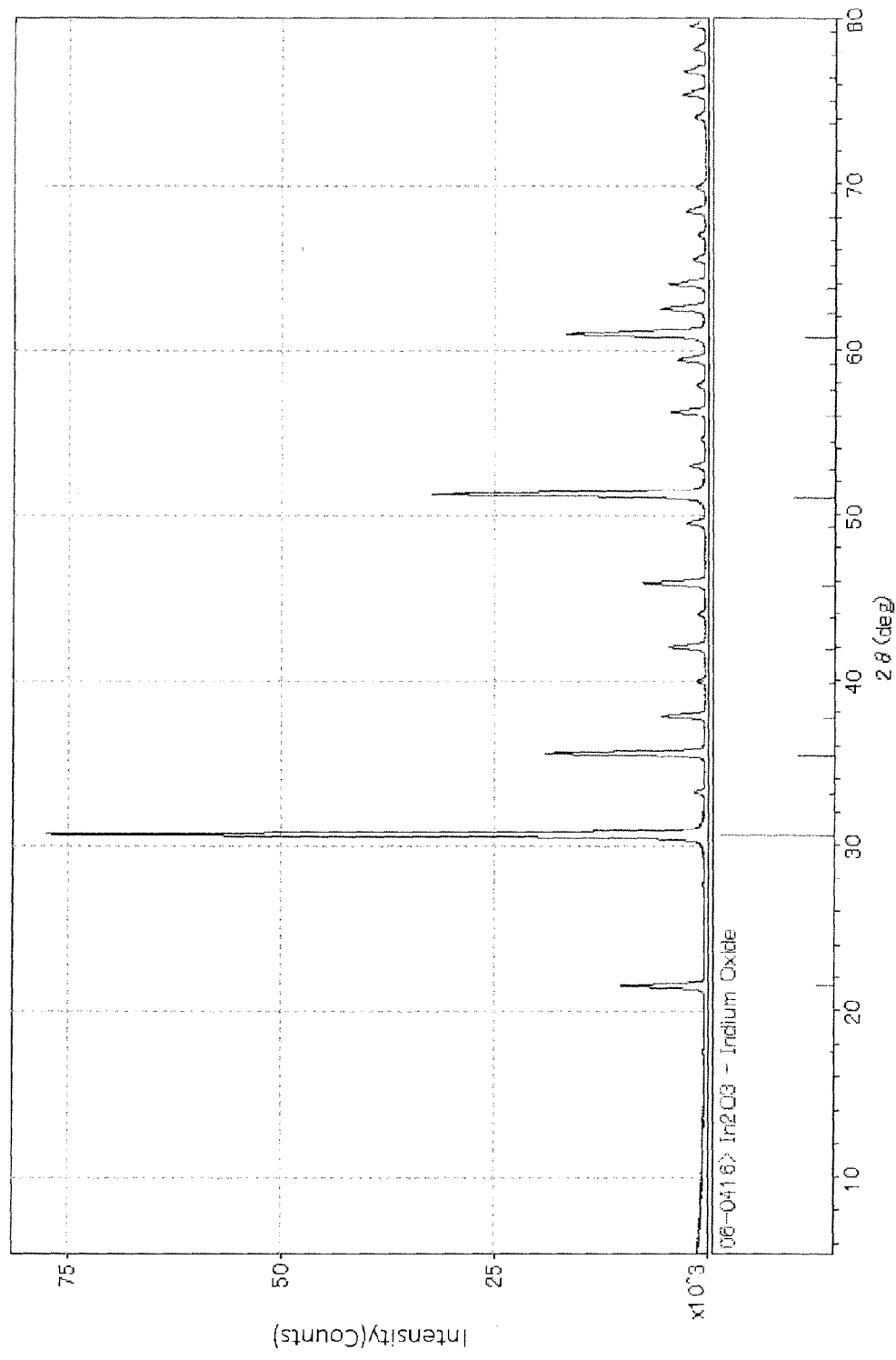
FIG. 3 is a view of an X-ray diffraction chart of a sintered body obtained in Example 2.

For the resulting sintered body, the crystal structure was examined by an X-ray diffraction apparatus (XRD). The X-ray chart of the sintered bodies obtained in Examples 1 and 2 are shown in FIGS. 2 and 3. As a result of the charts, a bixbyite structure of indium oxide was observed in the sintered bodies of Examples 1 and 2, indicating that the crystal structure was substantially a bixbyite structure of indium oxide.

The crystal structure can be confirmed by JCPDS (Joint Committee of Powder Diffraction Standards) card. The bixbyite structure of indium oxide was shown in No. 06-0416 of JCPDS.

From the results of XRD, it was confirmed that the bixbyite structure of indium oxide was confirmed in Examples 3 to 14, and the crystal structure was found to be substantially a bixbyite structure of indium oxide. For the sintered bodies of Examples 1 to 14, $GaInO_3$ or $Al_2O_3$ which causes nodules could not be observed.

The measuring conditions of the X-ray diffraction measurement (XRD) are as follows.

Apparatus: Ultima-III, manufactured by Rigaku Corporation
X rays: Cu-Kα rays (wavelength: 1.5406 Å, monochromatized by means of a graphite monochrometer)

2θ-θ reflection method, continuous scanning (1.0°/min)
Sampling interval: 0.02°
Slit DS, SS: ⅔°, RS: 0.6 mm For the resulting sintered body, dispersion of Ga or Al was examined by the electron probe microanalyzer (EPMA) measurement. As a result, an aggregate of Ga or Al each having a size of 5 μm or more was not observed, and it was understood that the sintered bodies of Examples 1 to 14 were significantly excellent in dispersibility and uniformity.

The measuring conditions of EPMA are as follows.
Name of apparatus: JXA-8200 (manufactured by JEOL Ltd.)
Measurement conditions
Acceleration voltage: 15 kV
Irradiation current: 50 nA
Irradiation time (per point): 50 mS

[Production of a Sputtering Target]

The surfaces of the sintered bodies were ground by means of a surface grinder. The corners were cut by means of a diamond cutter and the oxide sintered bodies were laminated to a backing plate, whereby sputtering targets each having a diameter of 4 inches were obtained. For Examples 1, 3 to 5, and 9 to 12, 6 targets each having a width of 200 mm, a length of 1700 mm and a thickness of 10 mm were fabricated for AC sputtering deposition.

[Confirmation of Occurrence of Abnormal Discharge]

The resulting sputtering targets having a diameter of 4 inches were mounted in a DC sputtering apparatus. As the atmosphere, a mixed gas obtained by adding a $H_2O$ gas in an amount of 2% in terms of partial pressure was added to an argon gas, and 10 kWh continuous sputtering was conducted under the following conditions:

Sputtering pressure: 0.4 Pa
Substrate temperature: room temperature
DC output: 400 W Variations in voltage during sputtering were stored in a data logger to confirm occurrence of abnormal discharge. The results are shown in Table 1.

Occurrence of the above-mentioned abnormal discharge was confirmed by detecting abnormal discharge by monitoring variations in voltage. Specifically, a case where variations in voltage which occurred during a 5-minute measurement accounted for 10% or more of the working voltage during the sputtering operation was evaluated as abnormal discharge. In particular, when the working voltage varies ±10% in 0.1 sec during the sputtering operation, a micro-arc which is abnormal discharge of sputtering discharge may have occurred. In such a case, the yield of a device may be lowered, leading to difficulty in mass production of a device.

[Confirmation of Generation of Nodules]

Further, by using the sputtering targets having a diameter of 4 inches, and by using as the atmosphere a mixed gas in which 3% (in terms of partial pressure) hydrogen gas was added to an argon gas, sputtering was conducted continuously for 40 hours. Occurrence of nodules was confirmed. As a result, on the surface of the sputtering targets in Examples 1 to 14, no nodules were observed.

The sputtering conditions were as follows. Sputtering pressure: 0.4 Pa, DC output: 100 W, Substrate temperature: room temperature. The hydrogen gas was added to the atmospheric gas in order to promote the generation of nodules.

As for observation of the nodules, a change in the target surface after sputtering was observed by means of a stereoscopic microscope (magnification: ×50), and the average number of nodules with a size of 20 μm or more which were generated in a viewing field of 3 $mm^2$ was calculated. The number of generated nodules was shown in Table 1.

Comparative Examples 1 to 4

The sintered bodies and the sputtering targets were produced and evaluated in the same manner as in Examples 1 to 14, except that the raw material powders were mixed at atomic ratios Ga/(In+Ga) or Al/(In+Al), the content of the positive tetravalent metal and the heating rate (from 800° C. to the sintering temperature), the sintering temperature and the sintering time were changed to those shown in Table 1. The results are shown in Table 1.

In the sputtering targets of Comparative Examples 1 to 4, abnormal discharge occurred at the time of sputtering, and nodules were observed on the target surface. In the targets of Comparative Examples 1 and 2, a $GaInO_3$ phase was observed, and in the targets of Comparative Examples 3 and 4, an $Al_2O_3$ phase was observed. The $GaInO_3$ phase can be confirmed by the JCPDS card No. 21-0334 and the $Al_2O_3$ phase can be confirmed by the JCPDS card No. 10-173.

Since the $GaInO_3$ phase or the $Al_2O_3$ phase is a high-resistant phase, it is thought that it causes nodules to be generated.

The sintered body of Comparative Examples 1 to 4 had a composition in which the content of the positive tetravalent metal X was outside the range of exceeding 100 at. ppm and 1100 at. ppm or less, and, since the sintering was conducted at a heating rate (800° C. to the sintering temperature) of exceeding 2° C./min, the relative density was less than 97% and the bulk resistance exceeding 5 mΩcm.

TABLE 1

| | Ga/(In + Ga) (atomic ratio) | Al/(In + Al) (atomic ratio) | Positive tetravalent X | Content of X (at.ppm) | Heating rate [° C./min] (from 800° C. to sintering temperature) | Sintering temperature [° C.] | Sintering time [hr] | Generated compound | Target relative density [%] | Bulk resistance [mΩcm] | Occurrence of nodules in the sputtering | Number of nodules [per/3 $mm^2$] |
|---|---|---|---|---|---|---|---|---|---|---|---|---|
| Ex. 1 | 0.072 | 0 | Sn | 400 | 0.20 | 1450 | 15 | $In_2O_3$ | 99 | 1.4 | None | 0 |
| Ex. 2 | 0.072 | 0 | Sn | 600 | 0.20 | 1450 | 15 | $In_2O_3$ | 98 | 1.1 | None | 0 |
| Ex. 3 | 0.001 | 0 | Sn | 600 | 0.20 | 1400 | 15 | $In_2O_3$ | 98 | 1.9 | None | 0 |
| Ex. 4 | 0.015 | 0 | Sn | 500 | 0.20 | 1400 | 12 | $In_2O_3$ | 99 | 1.9 | None | 0 |
| Ex. 5 | 0.02 | 0 | Zr | 400 | 0.15 | 1450 | 15 | $In_2O_3$ | 99 | 1.5 | None | 0 |
| Ex. 6 | 0.05 | 0 | Ti | 200 | 0.15 | 1450 | 20 | $In_2O_3$ | 97 | 1.9 | None | 0 |
| Ex. 7 | 0.072 | 0 | Si | 200 | 0.10 | 1500 | 20 | $In_2O_3$ | 97 | 1.6 | None | 0 |
| Ex. 8 | 0.12 | 0 | Sn | 120 | 0.15 | 1500 | 20 | $In_2O_3$ | 98 | 1.4 | None | 0 |
| Ex. 9 | 0.072 | 0 | Zr | 300 | 0.15 | 1400 | 12 | $In_2O_3$ | 98 | 1.1 | None | 0 |
| Ex. 10 | 0 | 0.013 | Sn | 300 | 0.15 | 1400 | 15 | $In_2O_3$ | 99 | 2.5 | None | 0 |

TABLE 1-continued

| | Ga/(In + Ga) (atomic ratio) | Al/(In + Al) (atomic ratio) | Positive tetravalent X | Content of X (at.ppm) | Heating rate [° C./min] (from 800° C. to sintering temperature) | Sintering temperature [° C.] | Sintering time [hr] | Generated compound | Target relative density [%] | Bulk resistance [mΩcm] | Occurrence of nodules in the sputtering | Number of nodules [per/3 mm²] |
|---|---|---|---|---|---|---|---|---|---|---|---|---|
| Ex. 11 | 0 | 0.013 | Zr | 500 | 0.15 | 1400 | 15 | In₂O₃ | 99 | 2.0 | None | 0 |
| Ex. 12 | 0 | 0.001 | Sn | 600 | 0.15 | 1400 | 20 | In₂O₃ | 98 | 2.3 | None | 0 |
| Ex. 13 | 0 | 0.02 | Ti | 200 | 0.30 | 1450 | 20 | In₂O₃ | 97 | 2.8 | None | 0 |
| Ex. 14 | 0 | 0.02 | Si | 200 | 0.30 | 1450 | 20 | In₂O₃ | 98 | 2.6 | None | 0 |
| Com. Ex. 1 | 0.12 | 0 | Sn | 2000 | 6.5 | 1100 | 8 | In₂O₃, GaInO₃ | 94 | 6.7 | Micr arc generated | 2 |
| Com. Ex. 2 | 0.15 | 0 | Sn | 30 | 5.5 | 1200 | 8 | In₂O₃, GaInO₃ | 95 | 7.8 | Microarc generated | 6 |
| Com. Ex. 3 | 0 | 0.09 | Sn | 2000 | 6.5 | 1100 | 8 | In₂O₃, GaInO₃ | 92 | 6.2 | Microarc generated | 13 |
| Com. Ex. 4 | 0 | 0.085 | Sn | 30 | 6.5 | 1100 | 8 | In₂O₃, GaInO₃ | 95 | 9.4 | Microarc generated | 11 |

Examples 15 to 26

[Deposition of an Oxide Semiconductor Thin Film]

The 4-inch targets produced in Examples 1 to 7 and 10 and 14 shown in Table 2 produced in Examples 1 to 7 and 10 to 14 were mounted in a magnetron sputtering apparatus, and slide glass (#1737, manufactured by Corning Inc.) was installed as a substrate. By the DC magnetron sputtering method, a 50 nm-thick oxide thin film was formed on slide glass under the following conditions.

At the time of film formation, an Ar gas, an $O_2$ gas and a $H_2O$ gas were introduced at partial pressures (%) shown in Table 2. The substrate on which an amorphous film was formed was heated in an atmosphere at 300° C. for 60 minutes whereby an oxide semiconductor film was formed due to the crystallization of the amorphous film.

Sputtering conditions were as follows.
Substrate temperature: 25° C.
Ultimate pressure: $8.5 \times 10^{-5}$ Pa
Atmospheric gas: Ar gas, $O_2$ gas and/or $H_2O$ gas (for partial pressure, see TABLE 2)
Sputtering pressure (total pressure): 0.4 Pa
Input power: DC 100 W
S (substrate)-T (target) distance: 70 mm

[Evaluation of an Oxide Semiconductor Thin Film]

A glass substrate on which a film was formed was set in a Resi Test 8300 (manufactured by Toyo Technical Co., Ltd.), and the hall effect was evaluated at room temperature. Further, by the ICP-AES analysis, it was confirmed that the atomic ratio of each element contained in the oxide thin film was the same as that of the sputtering target.

The crystal structure was examined by means of an X-ray diffraction measurement apparatus. No diffraction peaks were observed immediately after the deposition of the thin film, and hence it was confirmed that the thin film was amorphous. After conducting a heat treatment (annealing) in the air at 300° C. for 60 minutes, diffraction peaks were observed, and the thin film was confirmed to be crystallized.

As a result of analysis of the chart, in the thin film after the crystallization, a bixbiyte structure which substantially comprised indium oxide was observed.

The measuring conditions of the X-ray diffraction measurement (XRD) are as follows.
Apparatus: Ultima-III, manufactured by Rigaku Corporation
X rays: Cu-Kα rays (wavelength: 1.5406 Å, monochromatized by means of a graphite monochrometer)
2θ-θ reflection method, continuous scanning (1.0°/min)
Sampling interval: 0.02°
Slit DS, SS: ⅔°, RS: 0.6 mm

[Production of a Thin Film Transistor]

As a substrate, a conductive silicon substrate provided with a 100 nm-thick thermally oxidized film was used. The thermally oxidized film functioned as a gate insulating film and the conductive silicon part functioned as a gate electrode.

On the gate insulating film, a film was deposited by sputtering under the conditions shown in Table 2, whereby a 50 nm-thick amorphous thin film was fabricated. As a resist, OFPR#800 (manufactured by Tokyo Ohka Kogyo Co., Ltd.) was used. Coating, pre-baking (80° C., 5 minutes) and exposure were performed. After development, post-baking was performed (120° C., 5 minutes), etched with oxalic acid, and patterned into a desired shape. Thereafter, the film was subjected to a heat treatment at 300° C. for 60 minutes in a hot-air oven (annealing treatment).

Thereafter, Mo (200 nm) was deposited by sputtering, and source/drain electrodes were patterned by channel etching in a desired shape. Further, $SiN_x$ was formed into a film by the plasma CVD (PECVD) method to obtain a protective film. A contact hole was formed by using hydrofluoric acid, whereby a thin film transistor was fabricated.

For the thus fabricated thin film transistor, a field effect mobility (μ), an S value and a threshold voltage (Vth) were evaluated. These values were measured by using a semiconductor parameter analyzer (4200SCS, manufactured by Keithley Instruments, Inc.) at room temperature in a light-shielding (in a shield box) environment. The results are shown in Table 2.

For the produced transistor, transmission properties were evaluated with the drain voltage (Vd) and the gate voltage (Vg) being 1V and −15 to 20V, respectively. The field effect mobility (μ) was calculated from the linear mobility, and defined as the maximum value of Vg–μ.

Comparative Examples 5 and 6

By using the 4-inch targets fabricated in Comparative Examples 1 and 3, oxide semiconductor thin films and thin film transistors were fabricated and evaluated in the same manner as in Examples 15 to 26 in accordance with the sputtering and heating (annealing) conditions shown in Table 2. The results are shown in Table 2.

As shown in Table 2, the devices of Comparative Examples 5 and 6 had a field mobility of less than 30 cm$^2$/Vs, which was significantly lower than those in Examples 15 to 26.

TABLE 2

|  |  | Example 15 | Example 16 | Example 17 | Example 18 |
|---|---|---|---|---|---|
|  | Target composition | Ga/(In + Ga) = 0.072<br>X:Sn<br>Content of<br>X = 400 ppm | Ga/(In + Ga) = 0.072<br>X:Sn<br>Content of<br>X = 600 ppm | Ga/(In + Ga) = 0.001<br>X:Sn<br>Content of<br>X = 600 ppm | Ga/(In + Ga) = 0.015<br>X:Sn<br>Content of<br>X = 500 ppm |
| Sputtering conditions | Ultimate pressure (Pa) | 8.5 × 10$^{-5}$ | 8.5 × 10$^{-5}$ | 8.5 × 10$^{-5}$ | 8.5 × 10$^{-5}$ |
|  | Sputtering pressur (Pa) | 0.4 | 0.4 | 0.4 | 0.4 |
|  | [H$_2$O]/([H$_2$O] + [Ar] + [O$_2$]) (%) | 1 | 1 | 2 | 1 |
|  | [Ar]/([H$_2$O] + [Ar] + [O$_2$]) (%) | 99 | 96 | 98 | 99 |
|  | [O$_2$]/([H$_2$O] + [Ar] + [O$_2$]) (%) | 0 | 3 | 0 | 0 |
|  | Water partial pressure (Pa) | 4.0 × 10$^{-3}$ | 4.0 × 10$^{-3}$ | 8.0 × 10$^{-3}$ | 4.0 × 10$^{-3}$ |
|  | Sputtering method | DC | DC | DC | DC |
|  | T-S distance (mm) | 70 | 70 | 70 | 70 |
|  | Film thickness (nm) | 50 | 50 | 50 | 50 |
|  | Substrate temperature (° C.) | 25 | 25 | 25 | 25 |
| Annealing conditions | Annealing temperature (° C.) | 300 | 300 | 300 | 300 |
|  | Annealing time (min) | 60 | 60 | 60 | 60 |
|  | Atmosphere | Air | Air | Air | Air |
| Hall measurement | Carrier concentration(cm$^{-3}$) | 1.23 × 10$^{17}$ | 9.75 × 10$^{16}$ | 2.99 × 10$^{17}$ | 2.61 × 10$^{17}$ |
| TFT | Channel width/Channel length (μm) | 20/10 | 20/10 | 20/10 | 20/10 |
|  | Source/drain | Mo | Mo | Mo | Mo |
|  | Source/drain patterning | Channel etching | Channel etching | Channel etching | Channel etching |
|  | Protective film | SiNx | SiNx | SiNx | SiNx |
|  | Mohillity (cm$^2$/Vs) | 45.3 | 38.3 | 39.2 | 41.9 |
|  | Threshold voltage (V) | 1.2 | 1.7 | 1.34 | 0.04 |
|  | S value (V/dec) | 0.19 | 0.15 | 0.13 | 0.28 |
|  |  | Example 19 | Example 20 | Example 21 | Example 22 |
|  | Target composition | Ga/(In + Ga) = 0.02<br>X:Zr<br>Content of<br>X = 400 ppm | Ga/(In + Ga) = 0.05<br>X:Ti<br>Content of<br>X = 200 ppm | Ga/(In + Ga) = 0.072<br>X:Si<br>Content of<br>X = 200 ppm | Al/(In + Al) = 0.013<br>X:Sn<br>Content of<br>X = 300 ppm |
| Sputtering conditions | Ultimate pressure (Pa) | 8.5 × 10$^{-5}$ | 8.5 × 10$^{-5}$ | 8.5 × 10$^{-5}$ | 8.5 × 10$^{-5}$ |
|  | Sputtering pressure (Pa) | 0.4 | 0.4 | 0.4 | 0.4 |
|  | [H$_2$O]/([H$_2$O] + [Ar] + [O$_2$]) (%) | 1 | 1 | 2 | 1 |
|  | [Ar]/([H$_2$O] + [Ar] + [O$_2$]) (%) | 97 | 99 | 98 | 94 |
|  | [O$_2$]/([H$_2$O] + [Ar] + [O$_2$]) (%) | 2 | 0 | 0 | 0 |
|  | Water partial pressure (Pa) | 4.0 × 10$^{-3}$ | 4.0 × 10$^{-3}$ | 8.0 × 10$^{-3}$ | 4.0 × 10$^{-3}$ |
|  | Sputtering method | DC | DC | DC | DC |
|  | T-S distance (mm) | 70 | 70 | 70 | 70 |
|  | Film thickness (nm) | 50 | 50 | 50 | 50 |
|  | Substrate temperature (° C.) | 25 | 25 | 25 | 25 |
| Annealing conditions | Annealing temperature (° C.) | 300 | 300 | 300 | 300 |
|  | Annealing time (min) | 60 | 60 | 60 | 60 |
|  | Atmosphre | Air | Air | Air | Air |
| Hall measurement | Carrier concentration (cm$^{-3}$) | 3.26 × 10$^{17}$ | 1.83 × 10$^{17}$ | 2.76 × 10$^{17}$ | 5.88 × 10$^{17}$ |
| TFT | Channel width/Channel length (μm) | 20/10 | 20/10 | 20/10 | 20/10 |
|  | Source/drain | Mo | Mo | Mo | Mo |
|  | Source/draing patterning | Channel etching | Channel etching | Channel etching | Channel etching |
|  | Protective film | SiNx | SiNx | SiNx | SiNx |
|  | Mobility (cm$^2$/Vs) | 38.1 | 41.2 | 36.7 | 38.2 |
|  | Threshold voltage (V) | 0.46 | 2.1 | 0.03 | 0.02 |
|  | S value (V/dec) | 0.20 | 0.28 | 0.17 | 0.25 |
|  |  | Example 23 | Example 24 | Example 25 | Example 26 |
|  | Target composition | Al/(In + Al) = 0.013<br>X:Zr<br>Content of<br>X = 500 ppm | Al/(In + Al) = 0.001<br>X:Sn<br>Content of<br>X = 600 ppm | Al/(In + Al) = 0.02<br>X:Ti<br>Content of<br>X = 200 ppm | Al/(In + Al) = 0.02<br>X:Si<br>Content of<br>X = 200 ppm |
| Sputtering conditions | Ultimate pressure (Pa) | 8.5 × 10$^{-5}$ | 8.5 × 10$^{-5}$ | 8.5 × 10$^{-5}$ | 8.5 × 10$^{-5}$ |
|  | Sputtering pressure (Pa) | 0.4 | 0.4 | 0.4 | 0.4 |
|  | [H$_2$O]/([H$_2$O] + [Ar] + [O$_2$]) (%) | 1 | 2 | 2 | 2 |
|  | [Ar]/([H$_2$O] + [Ar] + [O$_2$]) (%) | 99 | 98 | 98 | 95 |
|  | [O$_2$]/([H$_2$O] + [Ar] + [O$_2$]) (%) | 0 | 0 | 0 | 3 |
|  | Water partial pressure (Pa) | 4.0 × 10$^{-3}$ | 8.0 × 10$^{-3}$ | 8.0 × 10$^{-3}$ | 8.0 × 10$^{-3}$ |
|  | Sputtering method | DC | DC | DC | DC |

TABLE 2-continued

|  |  |  |  |  |  |
|---|---|---|---|---|---|
| | T-S distance (mm) | 70 | 70 | 70 | 70 |
| | Film thickness (nm) | 50 | 50 | 50 | 50 |
| | Substrate temperature (° C.) | 25 | 25 | 25 | 25 |
| Annealing conditions | Annealing temperature (° C.) | 300 | 300 | 300 | 300 |
| | Annealing time (min) | 60 | 60 | 60 | 60 |
| | Atmosphre | Air | Air | Air | Air |
| Hall measurement | Carrier density (cm⁻3) | $4.37 \times 10^{17}$ | $4.99 \times 10^{17}$ | $2.75 \times 10^{17}$ | $4.17 \times 10^{17}$ |
| TFT | Channel width/Channel length (μm) | 20/10 | 20/10 | 20/10 | 20/10 |
| | Source/drain | Mo | Mo | Mo | Mo |
| | Source/drain patterning | Channel etching | Channel etching | Channel etching | Channel etching |
| | Protective film | SiN$x$ | SiN$x$ | SiN$x$ | SiN$x$ |
| | Mobility (cm²/Vs) | 35.1 | 36.4 | 36.9 | 38.1 |
| | Threshold voltage (V) | 1.4 | 1.8 | 0.9 | 1.0 |
| | S value (V/dec) | 0.29 | 0.21 | 0.19 | 0.17 |

| | | Com. Ex. 5 | Com. Ex. 6 |
|---|---|---|---|
| | Target composition | Ga/(In + Ga) = 0.12  X:Sn  Content of X = 2000 ppm | Al/(In + Al) = 0.09  X:Sn  Content of X = 2000 ppm |
| Sputteing conditions | Ultimate pressure (Pa) | $8.5 \times 10^{-5}$ | $8.5 \times 10^{-5}$ |
| | Sputtering pressure (Pa) | 0.4 | 0.4 |
| | [H₂O]/([H₂O] + [Ar] + [O₂]) (%) | 2 | 2 |
| | [Ar]/([H₂O] + [Ar] + [O₂]) (%) | 98 | 98 |
| | [O₂]/([H₂O] + [Ar] + [O₂]) (%) | 0 | 0 |
| | Water partial pressure (Pa) | $8.0 \times 10^{-3}$ | $8.0 \times 10^{-3}$ |
| | Sputtering method | DC | DC |
| | T-S distance (mm) | 70 | 70 |
| | Film thickness (nm) | 50 | 50 |
| | Substrate temperature (° C.) | 25 | 25 |
| Annealing conditions | Annealing temperature (° C.) | 300 | 300 |
| | Annealing time (min) | 60 | 60 |
| | Atmosphere | Air | Air |
| Hall measurement | Carrier concentration (cm⁻³) | $2.08 \times 10^{18}$ | $1.02 \times 10^{18}$ |
| TFT | Channel width/Channel length (μm) | 20/10 | 20/10 |
| | Soure/drain | Mo | Mo |
| | Source/drain patterning | Channel etching | Channel etching |
| | Protective film | SiN$x$ | SiN$x$ |
| | Mobility (cm²/Vs) | 21.8 | 19.3 |
| | Threshold voltage (V) | −0.01 | −0.24 |
| | S value (V/dec) | 0.43 | 0.52 |

Example 27

In accordance with the sputtering conditions and annealing conditions shown in Table 3, the oxide semiconductor thin film and the thin film transistor were fabricated and evaluated in the same manner as in Examples 15 to 26 under the conditions shown in Table 3. The results are shown in Table 3. In this example, AC sputtering was conducted instead of DC sputtering.

As the AC sputtering, the deposition apparatus as shown in FIG. 1 (disclosed in JP-A-2005-290550) was used.

Specifically, as the target, 6 targets 31*a* to 31*f* (each having a width of 200 mm, a length of 1700 mm and a thickness of 10 mm) fabricated in Example 1 were used. These targets 31*a* to 31*f* were arranged such that they remote from each other with an interval of 2 mm. The width of the magnetic field forming means 40*a* to 40*f* was 200 mm as in the case of 31*a* to 31*f*.

From the gas supply system, Ar, H₂O and O₂ as the sputtering gas were respectively introduced into the system. The sputtering conditions were as follows. Film forming atmosphere: 0.5 Pa, alternate power: 3 W/cm² (=10.2 kW/3400 cm²), and frequency: 10 kHz.

Under the above-mentioned conditions, deposition was performed for 10 seconds. The film thickness of the resulting thin film was measured and found to be 11 nm. The deposition speed was as high as 66 nm/min, which was suited to mass production.

The resulting thin film was put in an electric furnace together with the glass substrate, and subjected to a heat treatment in the air at 300° C. for 60 minutes (in the atmosphere). The thin film was cut into a size of 1 cm², and then subjected to a hall effect treatment by the four probe method. As a result, the carrier concentration was $1.62 \times 10^{17}$ cm⁻³, indicating that the film became a sufficient semiconductor.

As a result of an XRD measurement, it was confirmed that the oxide thin film was amorphous immediately after the deposition, and was crystallized after anealing in the air at 300° C. for 60 minutes. As a result of analysis of the chart, it was confirmed that a substantial bixbyite structure of indium oxide was observed in the crystallized thin film.

Also, by the ICP-AES analysis, it was confirmed that the atomic ratio of each element contained in the oxide thin film was the same as that of the sputtering target.

Examples 28 to 34

By using the targets of Examples 3 to 5 and 9 to 12, under the sputtering conditions and the annealing conditions shown in Table 3, oxide semiconductor thin films and thin film transistors were fabricated and evaluated in the same manner as in Example 27. The results are shown in Table 3.

From the results of the hall effect measurement, it was confirmed that each thin film became a semiconductor.

From the XRD measurement, it was confirmed that the film was amorphous immediately after the deposition, and was crystallized after the annealing treatment. As a result of the analysis of the chart, it was confirmed that a substantial bixbyite structure of indium oxide was observed in the crystallized thin film.

Comparative Examples 7 and 8

By using the 6 targets fabricated in Comparative Examples 1 and 3, each having a width of 200 mm, a length of 1700 mm and a thickness of 10 mm under the sputtering conditions and the heat treatment (annealing) conditions shown in Table 3, oxide semiconductor thin films and thin film transistors were fabricated and evaluated in the same manner as in Example 27. The results are shown in Table 3.

As shown in Table 3, the devices in Comparative Examples 7 and 8 had a low field effect mobility of less than 30 cm$^2$/Vs, which was significantly low as compared with those of Examples 27 to 34.

TABLE 3

| | | Example 27 | Example 28 | Example 29 | Example 30 |
|---|---|---|---|---|---|
| | Target composition | Ga/(In + Ga) = 0.072 X:Sn Content of X = 400 ppm | Ga/(In + Ga) = 0.001 X:Sn Content of X = 600 ppm | Ga/(In + Ga) = 0.015 X:Sn Content of X = 500 ppm | Ga/(In + Ga) = 0.02 X:Zr Content of X = 400 ppm |
| Sputtering conditions | Ultimate pressure (Pa) | $5.0 \times 10^{-5}$ | $5.0 \times 10^{-5}$ | $5.0 \times 10^{-5}$ | $5.0 \times 10^{-5}$ |
| | Sputtering pressure | 0.5 | 0.65 | 0.65 | 1.0 |
| | [H$_2$O]/([H$_2$O] + [Ar] + [O$_2$]) (%) | 1 | 2 | 1 | 2 |
| | [Ar]/([H$_2$O] + [Ar] + [O$_2$]) (%) | 99 | 98 | 96 | 98 |
| | [O$_2$]/([H$_2$O] + [Ar] + [O$_2$]) (%) | 0 | 0 | 3 | 0 |
| | Water partial pressure (Pa) | 0.005 | 0.013 | 0.0065 | 0.02 |
| | Sputtering method | AC | AC | AC | AC |
| | AC power density (W/cm$^2$) | 3 | 5 | 7 | 3 |
| | AC frequency (Hz) | 10k | 500k | 20k | 500k |
| | Film thickness (nm) | 50 | 50 | 35 | 50 |
| | Substrate temperature (° C.) | RT | 80 | RT | 70 |
| Annealing conditions | Annealing temperature (° C.) | 300 | 400 | 400 | 300 |
| | Annealing time (min) | 60 | 30 | 30 | 60 |
| | Atmosphere | Air | Air | Air | Air |
| Hall measurement | Carrier concentration(cm$^{-3}$) | $1.62 \times 10^{17}$ | $2.43 \times 10^{17}$ | $3.90 \times 10^{17}$ | $2.62 \times 10^{17}$ |
| TFT | Channel width/Channel length (μm) | 20/5 | 20/5 | 20/5 | 20/5 |
| | Soure/drain | Mo | Mo | Mo | Mo |
| | Source/drain patterning | Channel etching | Channel etching | Channel etching | Channel etching |
| | Protective film | SiN$x$ | SiN$x$ | SiN$x$ | SiN$x$ |
| | Mobility (cm2/Vs) | 39.8 | 35.0 | 39.9 | 35.4 |
| | Threshold voltage (V) | 0.47 | 1.3 | 2.3 | 1.4 |
| | S value (V/dec) | 0.25 | 0.19 | 0.17 | 0.23 |

| | | Example 31 | Example 32 | Example 33 | Example 34 |
|---|---|---|---|---|---|
| | Target composition | Ga/(In + Ga) = 0.072 X:Zr Content of X = 300 ppm | Al/(In + Al) = 0.013 X:Sn Content of X = 300 ppm | Al/(In + Al) = 0.013 X:Zr Content of X = 500 ppm | Al/(In + Al) = 0.001 X:Sn Content of X = 600 ppm |
| Sputtering conditions | Ultimate pressure (Pa) | $5.0 \times 10^{-5}$ | $5.0 \times 10^{-5}$ | $5.0 \times 10^{-5}$ | $5.0 \times 10^{-5}$ |
| | Sputtering pressure (Pa) | 0.65 | 0.65 | 0.65 | 0.65 |
| | [H$_2$O]/([H$_2$O] + [Ar] + [O$_2$]) (%) | 2 | 3 | 3 | 2 |
| | [Ar]/([H$_2$O] + [Ar] + [O$_2$]) (%) | 96 | 97 | 97 | 98 |
| | [O$_2$]/([H$_2$O] + [Ar] + [O$_2$]) (%) | 2 | 0 | 0 | 0 |
| | Water partial pressure (Pa) | 0.013 | 0.0195 | 0.0195 | 0.013 |
| | Sputtering method | AC | AC | AC | AC |
| | AC power density (W/cm$^2$) | 7 | 7 | 5 | 5 |
| | AC frequency (Hz) | 50k | 50k | 500k | 50k |
| | Film thickness (nm) | 40 | 40 | 50 | 50 |
| | Substrate temperature (° C.) | 70 | 70 | 70 | 70 |
| Annealing conditions | Annealing temperature (° C.) | 300 | 300 | 300 | 300 |
| | Annealing time (min) | 120 | 60 | 120 | 60 |
| | Atmosphere | Air | Air | Air | Air |
| Hall measurement | Carrier concentration(cm$^{-3}$) | $9.73 \times 10^{16}$ | $3.73 \times 10^{17}$ | $4.83 \times 10^{17}$ | $1.41 \times 10^{17}$ |
| TFT | Channel width/Channel length (μm) | 20/5 | 20/5 | 20/5 | 20/5 |
| | Source/drain | Mo | Mo | Mo | Mo |
| | Source/drain patterning | Channel etching | Channel etching | Channel etching | Channel etching |
| | Protective film | SiN$x$ | SiN$x$ | SiN$x$ | SiN$x$ |
| | Mobility (cm$^2$/Vs) | 36.2 | 34.8 | 35.7 | 36.5 |
| | Threshold voltage (V) | 2.3 | 0.02 | 0.07 | 1.2 |
| | S value (V/dec) | 0.15 | 0.17 | 0.12 | 0.16 |

TABLE 3-continued

|  |  | Com. Ex. 7 | Com. Ex. 8 |
|---|---|---|---|
|  | Target composition | Ga/(In + Ga) = 0.12<br>X:Sn<br>Content of<br>X = 2000 ppm | Al/(In + Al) = 0.09<br>X:Sn<br>Content of<br>X = 2000 ppm |
| Sputtering<br>conditions | Ultimate pressure (Pa) | $5.0 \times 10^{-5}$ | $5.0 \times 10^{-5}$ |
|  | Sputtering pressure (Pa) | 1.0 | 1.0 |
|  | [H$_2$O]/([H$_2$O] + [Ar] + [O$_2$]) (%) | 2 | 2 |
|  | [Ar]/([H$_2$O] + [Ar] + [O$_2$]) (%) | 98 | 98 |
|  | [O$_2$]/([H$_2$O] + [Ar] + [O$_2$]) (%) | 0 | 0 |
|  | Water partial pressure (Pa) | 0.02 | 0.02 |
|  | Sputtering method | AC | AC |
|  | AC power density (W/cm$^2$) | 5 | 5 |
|  | AC frequency (Hz) | 500k | 500k |
|  | Film thickness (nm) | 50 | 50 |
|  | Substrate temperature (° C.) | 70 | 70 |
| Annealing<br>conditions | Annealing temperature (° C.) | 300 | 300 |
|  | Annealing time (min) | 60 | 60 |
|  | Atmosphere | Air | Air |
| Hall<br>measurement | Carrier concentration (cm$^{-3}$) | $1.03 \times 10^{18}$ | $3.11 \times 10^{18}$ |
| TFT | Channel width/Channel length (μm) | 20/5 | 20/5 |
|  | Source/drain | Mo | Mo |
|  | Source/drain patterning | Channel etching | Channel etching |
|  | Protective film | SiNx | SiNx |
|  | Mobility (cm$^2$/Vs) | 18.6 | 17.9 |
|  | Threshold voltage (V) | −0.05 | −1.06 |
|  | S value (V/dec) | 0.43 | 0.36 |

Examples 35 to 46

In accordance with the sputtering and annealing conditions shown in Table 4, the oxide semiconductor thin films (a quarts substrate was used as a substrate) and thin film transistors were fabricated in the same manner as in Examples 15 to 26.

The same evaluations as those in Examples 15 to 26 and the following evaluations were conducted. The results are shown in Table 4.

[Evaluation of the Band Gap of an Oxide Semiconductor Thin Film]

For the oxide semiconductor thin film formed on the quarts substrate, the band gap was evaluated by spectroscopic ellipsometry. Specifically, the absorption coefficient was calculated from the refractive index and the extinction coefficient, and on the assumption that the semiconductor was a direct transition semiconductor, the band gap was obtained from a graph of the square of the absorption coefficient and the energy. It was confirmed that, in the oxide semiconductor thin films of Examples 35 to 46, the band gap was 3.7 eV or more.

Further, by the ICP-AES analysis, it was confirmed that the atomic ratio of each element contained in the oxide thin film was the same as that of the sputtering target.

[Evaluation of a Thin Film Transistor]

For a thin film transistor fabricated as a thin film transistor for evaluating reliability, a DC bias stress test was conducted. This thin film transistor for evaluating reliability was fabricated in the same manner as in Examples 15 to 26 in accordance with the sputtering and annealing conditions shown in Table 4.

Specifically, before and after applying a DC stress (Vg=15V, Vd=15V, stress temperature of 80° C. or less) for 10000 seconds, and before and after applying a DC stress of Vg=−20V (under light irradiation (λ=400 nm) and at a stress temperature of 80° C. or less), the transfer properties of a TFT (threshold voltage) were measured. The amount of a variation is shown in Table 4.

As the light irradiation, a monochrometer type spectroscopic light source (CMS100: Asahi Spectra Co., Ltd.) was used and a light having a wavelength of 400 nm and an intensity of 200 μW/cm$^2$ was irradiated.

In the thin film transistors of Examples 35 to 46, a variation in threshold voltage was very small, and the absolute value of the threshold voltage shift before and after the application of a stress was less than 0.3 V. That is, it was revealed that the thin film transistors were hardly affected by DC stress or light-irradiation stress.

Comparative Examples 9 and 10

In accordance with the sputtering and annealing conditions shown in Table 4, the oxide semiconductor thin films (a quarts substrate was used as a substrate) and thin film transistors were fabricated in the same manner as in Examples 35 to 46. The same evaluations as those in Examples 35 to 46 and the following evaluations were conducted. The results are shown in Table 4.

As shown in Table 4, the thin film transistors of Comparative Examples 9 and 10 had a field effect mobility of less than 30 cm$^2$/Vs, which was significantly lower than those of Examples 35 to 46. Further, in the thin film transistors of Comparative Examples 9 and 10, the absolute value of the threshold voltage shift before and after the application of a stress (DC stress: Vg=15V, Vd=15V) was 0.3V or more. Since the content of the tetravalent metal exceeded 1100 ppm, a positive tetravalent metal forms an impurity state within the band gap. As a result, the reliability was lowered as compared with those in Examples.

TABLE 4

| | | Example 35 | Example 36 | Example 37 | Example 38 |
|---|---|---|---|---|---|
| | Target composition | Ga/(In + Ga) = 0.072 Positive tetravalent metal X:Sn Content of X = 400 ppm | Ga/(In + Ga) = 0.072 Positive tetravalent metal X:Sn Content of X = 600 ppm | Ga/(In + Ga) = 0.001 Positive tetravalent metal X:Sn Content of X = 600 ppm | Ga/(In + Ga) = 0.015 Positive tetravalent metal X:Sn Content of X = 500 ppm |
| Sputtering conditions | Ultimate pressure (Pa) | $8.5 \times 10^{-5}$ | $8.5 \times 10^{-5}$ | $8.5 \times 10^{-5}$ | $8.5 \times 10^{-5}$ |
| | Sputtering pressure (Pa) | 0.4 | 0.4 | 0.4 | 0.4 |
| | $[H_2O]/([H_2O] + [Ar] + [O_2])$ (%) | 1 | 1 | 1 | 1 |
| | $[Ar]/([H_2O] + [Ar] + [O_2])$ (%) | 99 | 96 | 96 | 99 |
| | $[O_2]/([H_2O] + [Ar] + [O_2])$ (%) | 0 | 3 | 3 | 0 |
| | Water partial pressure (Pa) | $4.0 \times 10^{-3}$ | $4.0 \times 10^{-3}$ | $4.0 \times 10^{-3}$ | $4.0 \times 10^{-3}$ |
| | Sputtering method | DC | DC | DC | DC |
| | T-S distance (mm) | 70 | 70 | 70 | 70 |
| | Film thickness (nm) | 50 | 50 | 50 | 50 |
| | Substrate temperature (° C.) | 70 | 70 | 70 | 70 |
| Annealing conditions | Annealing temperature (° C.) | 300 | 300 | 300 | 300 |
| | Annealing time (min) | 60 | 60 | 60 | 60 |
| | Atmosphere | Air | Air | Air | Air |
| Band gap | Eg (eV) | 3.82 | 3.82 | 3.80 | 3.85 |
| TFT | Channel width/Channel length (μm) | 20/10 | 20/10 | 20/10 | 20/10 |
| | Source/drain | Mo | Mo | Mo | Mo |
| | Source/drain patterning | Channel etching | Channel etching | Channel etching | Channel etching |
| | Protective film | SiNx | SiNx | SiNx | SiNx |
| | Mobility (cm²/Vs) | 45.9 | 42.8 | 43.0 | 44.6 |
| | Threshold voltage (V) | 0.8 | 1.5 | 0.3 | 0.8 |
| | S value (V/dec) | 0.12 | 0.12 | 0.18 | 0.18 |
| | Reliablity test (Vg = 15 V, Vd = 15 V) | ∠Vth = 0.18 V | ∠Vth = 0.15 V | ∠Vth = 0.18 V | ∠Vth = 0.22 V |
| | Reliablity test (Vg = −20 V, λ = 400 nm) | ∠Vth = −0.05 V | ∠Vth = −0.05 V | ∠Vth = −0.09 V | ∠Vth = −0.13 V |

| | | Example 39 | Example 40 | Example 41 | Example 42 |
|---|---|---|---|---|---|
| | Target composition | Ga/(In + Ga) = 0.02 Positive tetravalent metal X:Zr Content of X = 400 ppm | Ga/(In + Ga) = 0.05 Positive tetravalent metal X:Ti Content of X = 200 ppm | Ga/(In + Ga) = 0.072 Positive tetravalent metal X:Si Content of X = 200 ppm | Al/(In + Al) = 0.013 Positive tetravalent metal X:Sn Content of X = 300 ppm |
| Sputtering conditions | Ultimate pressure (Pa) | $8.5 \times 10^{-5}$ | $8.5 \times 10^{-5}$ | $8.5 \times 10^{-5}$ | $8.5 \times 10^{-5}$ |
| | Sputtering pressure (Pa) | 0.4 | 0.4 | 0.4 | 0.4 |
| | $[H_2O]/([H_2O] + [Ar] + [O_2])$ (%) | 1 | 1 | 1 | 1 |
| | $[Ar]/([H_2O] + [Ar] + [O_2])$ (%) | 99 | 99 | 99 | 96 |
| | $[O_2]/([H_2O] + [Ar] + [O_2])$ (%) | 0 | 0 | 0 | 3 |
| | Water partial pressure (Pa) | $4.0 \times 10^{-3}$ | $4.0 \times 10^{-3}$ | $4.0 \times 10^{-3}$ | $4.0 \times 10^{-3}$ |
| | Sputtering method | DC | DC | DC | DC |
| | T-S distance (mm) | 70 | 70 | 70 | 70 |
| | Film thickness (nm) | 50 | 50 | 50 | 50 |
| | Substrate temperature (° C.) | 70 | 70 | 70 | 70 |
| Annealing conditions | Annealing temperature (° C.) | 300 | 300 | 300 | 300 |
| | Annealing time (min) | 60 | 60 | 60 | 60 |
| | Atmosphere | Air | Air | Air | Air |
| Band gap | Eg (eV) | 3.81 | 3.82 | 3.82 | 3.79 |
| TFT | Channel width/Channel length (μm) | 20/10 | 20/10 | 20/10 | 20/10 |
| | Source/Drain | Mo | Mo | Mo | Mo |
| | Source/draing patterning | Channel etching | Channel etching | Channel etching | Channel etching |
| | Protective film | SiNx | SiNx | SiNx | SiNx |
| | Mobility (cm²/Vs) | 45.1 | 45.8 | 40.3 | 39.7 |
| | Threshold voltage (V) | 1.3 | 0.3 | 1.2 | 1.6 |
| | S value (V/dec) | 0.16 | 0.21 | 0.15 | 0.12 |
| | Reliability test (Vg = 15 V, Vd = 15 V) | ∠Vth = 0.15 V | ∠Vth = 0.13 V | ∠Vth = 0.17 V | ∠Vth = 0.15 V |
| | Reliablity test (Vg = −20 V, λ = 400 nm) | ∠Vth = −0.04 V | ∠Vth = −0.08 V | ∠Vth = −0.08 V | ∠Vth = −0.06 V |

| | | Example 43 | Example 44 | Example 45 | Example 46 |
|---|---|---|---|---|---|
| | Target composition | Al/(In + Al) = 0.013 Positive tetravalent X:Zr Content of X = 500 ppm | Al/(In + Al) = 0.001 Positive tetravalent X:Sn Content of X = 600 ppm | Al/(In + Al) = 0.02 Positive tetravalent X:Ti Content of X = 200 ppm | Al/(In + Al) = 0.02 Positive tetravalent X:Si Content of X = 200 ppm |

TABLE 4-continued

| | | | | | |
|---|---|---|---|---|---|
| Sputtering conditions | Ultimate pressure (Pa) | $8.5 \times 10^{-5}$ | $8.5 \times 10^{-5}$ | $8.5 \times 10^{-5}$ | $8.5 \times 10^{-5}$ |
| | Sputtering pressure (Pa) | 0.4 | 0.4 | 0.4 | 0.4 |
| | [H$_2$O]/([H$_2$O] + [Ar] + [O$_2$]) (%) | 1 | 1 | 1 | 1 |
| | [Ar]/([H$_2$O] + [Ar] + [O$_2$]) (%) | 99 | 99 | 99 | 96 |
| | [O$_2$]/([H$_2$O] + [Ar] + [O$_2$]) (%) | 0 | 0 | 0 | 3 |
| | Water partial pressure (Pa) | $4.0 \times 10^{-3}$ | $4.0 \times 10^{-3}$ | $4.0 \times 10^{-3}$ | $4.0 \times 10^{-3}$ |
| | Sputtering method | DC | DC | DC | DC |
| | T-S distance (mm) | 70 | 70 | 70 | 70 |
| | Film thickness (nm) | 50 | 50 | 50 | 50 |
| | Substrate temperature (° C.) | 70 | 70 | 70 | 70 |
| Annealing conditions | Annealing temperature (° C.) | 300 | 300 | 300 | 300 |
| | Annealing time (min) | 60 | 60 | 60 | 60 |
| | Atmosphere | Air | Air | Air | Air |
| Band gap | Eg (eV) | 3.80 | 3.78 | 3.81 | 3.81 |
| TFT | Channel width/Channel length (μm) | 20/10 | 20/10 | 20/10 | 20/10 |
| | Source/drain | Mo | Mo | Mo | Mo |
| | Source/drain patterning | Channel etching | Channel etching | Channel etching | Channel etching |
| | Protective film | SiN$x$ | SiN$x$ | SiN$x$ | SiN$x$ |
| | Mobility (cm$^2$/Vs) | 36.0 | 39.3 | 38.6 | 39.8 |
| | Threshold voltage (V) | 1.5 | 0.6 | 1.3 | 1.4 |
| | S value (V/dec) | 0.18 | 0.22 | 0.15 | 0.18 |
| | Reliablity test (Vg = 15 V, Vd = 15 V) | ∆Vth = 0.19 V | ∆Vth = 0.17 V | ∆Vth = 0.15 V | ∆Vth = 0.18 V |
| | Reliablity test (Vg = −20 V, λ = 400 nm) | ∆Vth = −0.07 V | ∆Vth = −0.05 V | ∆Vth = −0.08 V | ∆Vth = −0.05 V |

| | | Com. Ex. 9 | Com. Ex. 10 |
|---|---|---|---|
| | Target composition | Ga/(In + Ga) = 0.12 Positive tetravalent X:Sn Content of X = 2000 ppm | Al/(In + Al) = 0.09 Positive tetravalent X:Sn Content of X = 2000 ppm |
| Sputtering conditions | Ultimate pressure (Pa) | $8.5 \times 10^{-5}$ | $8.5 \times 10^{-5}$ |
| | Sputtering pressure (Pa) | 0.4 | 0.4 |
| | [H$_2$O]/([H$_2$O] + [Ar] + [O$_2$]) (%) | 3 | 3 |
| | [Ar]/([H$_2$O] + [Ar] + [O$_2$]) (%) | 97 | 97 |
| | [O$_2$]/([H$_2$O] + [Ar] + [O$_2$]) (%) | 0 | 0 |
| | Water partial pressure (Pa) | $1.2 \times 10^{-2}$ | $1.2 \times 10^{-2}$ |
| | Sputtering method | DC | DC |
| | T-S distance (mm) | 70 | 70 |
| | Film thickness (nm) | 50 | 50 |
| | Substrate temperature (° C.) | 25 | 25 |
| Annealing conditions | Annealing temperature (° C.) | 300 | 300 |
| | Annealing time (min) | 60 | 60 |
| | Atmosphere | Air | Air |
| Band gap | Eg (eV) | 3.80 | 3.79 |
| TFT | Channel width/Channel length (μm) | 20/10 | 20/10 |
| | Source/drain | Mo | Mo |
| | Source/drain patterning | Channel etching | Channel etching |
| | Protective film | SiN$x$ | SiN$x$ |
| | Mobility (cm$^2$/Vs) | 21.8 | 19.3 |
| | Threshold voltage (V) | −0.01 | −0.24 |
| | S value (V/dec) | 0.43 | 0.52 |
| | Reliablity test (Vg = 15 V, Vd = 15 V) | ∆Vth = 0.39 V | ∆Vth = 0.35 V |
| | Reliablity test (Vg = 15 V, Vd = 15 V) (Vg = −20 V, λ = 400 nm) | ∆Vth = −0.21 V | ∆Vth = −0.20 V |

INDUSTRIAL APPLICABILITY

The thin film of the invention can be used as a display, in particular, a large-area display.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification of a Japanese application on the basis of which the present application claims. Paris convention priority are incorporated herein by reference in its entirety.

The invention claimed is:

1. A sputtering target comprising a sintered body:
   the sintered body comprising:
   indium oxide doped with Ga, and
   a positive tetravalent metal in an amount greater than 100 at. ppm and less than or equal to 1100 at. ppm relative to a total of Ga and indium,
   a crystal structure of the sintered body consisting essentially of a bixbyite structure of the indium oxide, and
   metal elements in the sintered body consisting essentially of In, Ga and the positive tetravalent metal,
   wherein the sintered body does not comprise a crystal structure of GaInO$_3$.

2. The sputtering target according to claim 1, wherein an atomic ratio Ga/(Ga+In) of indium oxide doped with Ga, is 0.001 to 0.15.

3. The sputtering target according to claim 1, wherein the positive tetravalent metal is one or two or more elements selected from Sn, Zr, Ti and Si.

4. The sputtering target according to claim 1, wherein a bulk resistance of the sintered body is 5 mΩ cm or less.

5. The sputtering target according to claim 1, wherein a relative density of the sintered body is 97% or more.

6. A method for producing the sputtering target according to claim 1, comprising:
heating a formed body from 800° C. to a sintering temperature at a heating rate of 0.1 to 20° C./min; and
holding the heated formed body at the sintering temperature for 10 to 50 hours to allow it to be sintered;
wherein the sintering temperature is 1200° C. to 1650° C.

7. An oxide semiconductor thin film formed by a sputtering method using the sputtering target according to claim 1.

8. A method for producing the oxide semiconductor thin film according to claim 7, wherein deposition is conducted in an atmosphere of a mixed gas comprising a rare gas and one or more gases selected from a water vapor, an oxygen gas and a nitrous oxide gas.

9. The method for producing the oxide semiconductor thin film according to claim 8, wherein deposition is conducted in an atmosphere of a mixed gas comprising a rare gas and at least water vapor.

10. The method for producing the oxide semiconductor thin film according to claim 9, wherein an amount ratio of the water vapor contained in the atmosphere is 0.1% to 25% in terms of partial pressure.

11. The method for producing the oxide semiconductor thin film according to claim 8 comprising:
transporting substrates in sequence at positions opposing to 3 or more targets arranged in parallel with a prescribed interval in a vacuum chamber;
applying a negative potential and a positive potential alternately from an AC power source to each of the targets; and
causing plasma to be generated on a target by applying a potential from the AC power source while switching targets to which a potential is applied between two or more targets connected to this AC power source, thereby depositing a film on a substrate surface.

12. The method for producing the oxide semiconductor thin film according to claim 11, wherein an AC power density of the AC power source is in a range of 3 W/cm$^2$ to 20 W/cm$^2$.

13. The method for producing the oxide semiconductor thin film according to claim 11, wherein a frequency of the AC power source is 10 kHz to 1 MHz.

14. A thin film transistor comprising the oxide semiconductor thin film formed by the method according to claim 8 as a channel layer.

15. The thin film transistor according to claim 14, wherein a field effect mobility is 30 cm$^2$/Vs or more.

16. The thin film transistor according to claim 14, which comprises a protective film comprising SiNx, on the channel layer.

17. A display comprising the thin film transistor according to claim 14.

18. The sputtering target according to claim 1, wherein the sintered body comprising the positive tetravalent metal in an amount greater than 120 at. ppm and less than or equal to 700 at. ppm relative to a total of Ga and indium.

19. The sputtering target according to claim 1, wherein the sputtering target contains In and Ga in an amount exceeding 99 wt % of all metal elements in the sputtering target other than the positive tetravalent metal.

* * * * *